United States Patent
Sonehara et al.

(10) Patent No.: US 9,711,515 B1
(45) Date of Patent: Jul. 18, 2017

(54) METHOD OF MANUFACTURING SEMICONDUCTOR MEMORY DEVICE

(71) Applicant: Kabushiki Kaisha Toshiba, Minato-ku (JP)

(72) Inventors: Takeshi Sonehara, Yokkaichi (JP); Masaru Kito, Kuwana (JP)

(73) Assignee: KABUSHIKI KAISHA TOSHIBA, Minato-ku (JP)

(*) Notice: Subject to any disclaimer, the term of this patent is extended or adjusted under 35 U.S.C. 154(b) by 0 days.

(21) Appl. No.: 15/246,768

(22) Filed: Aug. 25, 2016

Related U.S. Application Data

(60) Provisional application No. 62/312,286, filed on Mar. 23, 2016.

(51) Int. Cl.
*H01L 27/115* (2017.01)
*H01L 21/768* (2006.01)
(Continued)

(52) U.S. Cl.
CPC .. *H01L 27/11556* (2013.01); *H01L 21/28273* (2013.01); *H01L 21/28518* (2013.01);
(Continued)

(58) Field of Classification Search
CPC ......... H01L 27/11556; H01L 21/28273; H01L 21/76895; H01L 29/665; H01L 29/456; H01L 21/28562; H01L 21/28518; H01L 29/41741; H01L 21/28568
See application file for complete search history.

(56) References Cited

U.S. PATENT DOCUMENTS

| 6,680,604 B2 * | 1/2004 | Muratov | G06F 1/26 |
| | | | 323/283 |
| 7,799,672 B2 | 9/2010 | Hashimoto et al. | |

(Continued)

FOREIGN PATENT DOCUMENTS

| JP | 11-176932 | 7/1999 |
| JP | 2009-200443 | 9/2009 |
| JP | 2010-192646 | 9/2010 |

OTHER PUBLICATIONS

U.S. Appl. No. 14/849,167, filed Sep. 9, 2015, Takao Oom Ori, et al.

*Primary Examiner* — Savitr Mulpuri
(74) *Attorney, Agent, or Firm* — Oblon, McClelland, Maier & Neustadt, L.L.P.

(57) ABSTRACT

A method of manufacturing a semiconductor memory device according to an embodiment comprises: alternately stacking first inter-layer insulating layers and first layers above a substrate; forming a first opening penetrating the layers stacked above the substrate; and forming a gate insulating layer and a semiconductor layer in the first opening. In addition, the method comprises: forming a second opening penetrating the layers stacked above the substrate; and forming a second inter-layer insulating layer on an inner wall of the second opening. Moreover, the method comprises: forming a first silicide layer and a barrier metal layer on the bottom surface of the second opening; and forming a silicon layer in the second opening such that a crevice is formed in an upper surface of the silicon layer along the second opening. Furthermore, the method comprises: removing part of the silicon layer; and siliciding the silicon layer via the crevice.

10 Claims, 46 Drawing Sheets

(51) Int. Cl.
  *H01L 27/11556* (2017.01)
  *H01L 21/28* (2006.01)
  *H01L 29/66* (2006.01)
  *H01L 29/45* (2006.01)
  *H01L 21/285* (2006.01)
  *H01L 29/417* (2006.01)

(52) U.S. Cl.
  CPC .. *H01L 21/28562* (2013.01); *H01L 21/28568* (2013.01); *H01L 21/76895* (2013.01); *H01L 29/41741* (2013.01); *H01L 29/456* (2013.01); *H01L 29/665* (2013.01)

(56) References Cited

U.S. PATENT DOCUMENTS

| | | | |
|---|---|---|---|
| 8,013,383 B2 | 9/2011 | Kidoh et al. | |
| 8,207,029 B2 * | 6/2012 | Ishikawa | H01L 27/11556 257/E21.21 |
| 8,557,691 B2 | 10/2013 | Sun et al. | |
| 8,598,032 B2 * | 12/2013 | Chen | H01L 27/11286 257/E23.169 |
| 9,064,969 B2 * | 6/2015 | Konno | H01L 29/792 |
| 9,153,566 B1 * | 10/2015 | Sato | H01L 25/074 |
| 9,570,464 B1 * | 2/2017 | Wakatsuki | H01L 27/11582 |
| 2012/0132981 A1 | 5/2012 | Imamura et al. | |
| 2014/0097484 A1 * | 4/2014 | Seol | H01L 29/42332 257/324 |
| 2015/0035036 A1 * | 2/2015 | Konno | H01L 27/11565 257/314 |
| 2015/0228663 A1 * | 8/2015 | Youn | H01L 27/11582 438/268 |

* cited by examiner

METHOD OF MANUFACTURING SEMICONDUCTOR MEMORY DEVICE

CROSS-REFERENCE TO RELATED APPLICATIONS

This application is based upon and claims the benefit of U.S. Provisional Patent Application No. 62/312,286, filed on Mar. 23, 2016, the entire contents of which are incorporated herein by reference.

BACKGROUND

Field

Embodiments described herein relate to a method of manufacturing a semiconductor memory device.

Description of the Related Art

A flash memory that stores data by accumulating a charge in a charge accumulation layer, is known. Such a flash memory is connected by a variety of systems such as NAND type or NOR type, and configures a semiconductor memory device. In recent years, a semiconductor memory device in which memory cells are disposed three-dimensionally (three-dimensional type semiconductor memory device) has been proposed to raise integration level.

DETAILED DESCRIPTION

A method of manufacturing a semiconductor memory device according to an embodiment comprises: alternately stacking a plurality of first inter-layer insulating layers and first layers above a substrate; forming a first opening that penetrates a plurality of the first inter-layer insulating layers and first layers; and forming a gate insulating layer and a semiconductor layer on an inner wall of the first opening. In addition, the method comprises: forming a second opening that penetrates a plurality of the first inter-layer insulating layers and first layers; forming a second inter-layer insulating layer on a bottom surface and an inner wall of the second opening; and removing a portion covering the bottom surface of the second opening, of the second inter-layer insulating layer. Moreover, the method comprises: forming a first silicide layer on the bottom surface of the second opening; forming a barrier metal layer on an upper surface of the first silicide layer and on a side surface of the second inter-layer insulating layer; and forming a silicon layer on an upper surface and side surface of the barrier metal layer such that a crevice is formed in an upper surface of the silicon layer along the second opening. Furthermore, the method comprises: removing part of the silicon layer; and siliciding the silicon layer via the crevice to form a second silicide layer.

Next, semiconductor memory devices according to embodiments will be described in detail with reference to the drawings. Note that these embodiments are merely examples, and are not shown with the intention of limiting the present invention.

For example, in the semiconductor memory devices described below, a memory string comprises a plurality of memory cells (memory transistors) arranged in a first direction that intersects an upper surface of a substrate. These memory cells each include: a semiconductor layer that extends in the above-described first direction and functions as a channel body; and a control gate electrode provided, via a gate insulating layer, on a side surface of the semiconductor layer.

One memory string may include one semiconductor layer, or may include two or more semiconductor layers joined at their one ends (lower ends).

In addition, the above-described memory cell may be a MONOS (Metal-Oxide-Nitride-Oxide-Semiconductor) type memory cell that includes: a charge accumulation layer configured from a nitride; and a control gate electrode made of a metal, or may be a SONOS (Semiconductor-Oxide-Nitride-Oxide-Semiconductor) type memory cell that includes a control gate electrode made of a semiconductor.

Moreover, the above-described gate insulating layer may include a floating gate, not the charge accumulation layer configured from a nitride. As for a floating gate type memory cell, refer to U.S. patent application Ser. No. 13/112,345 whose disclosure content is herewith incorporated by this reference.

First Embodiment

Configuration

Figure 1:
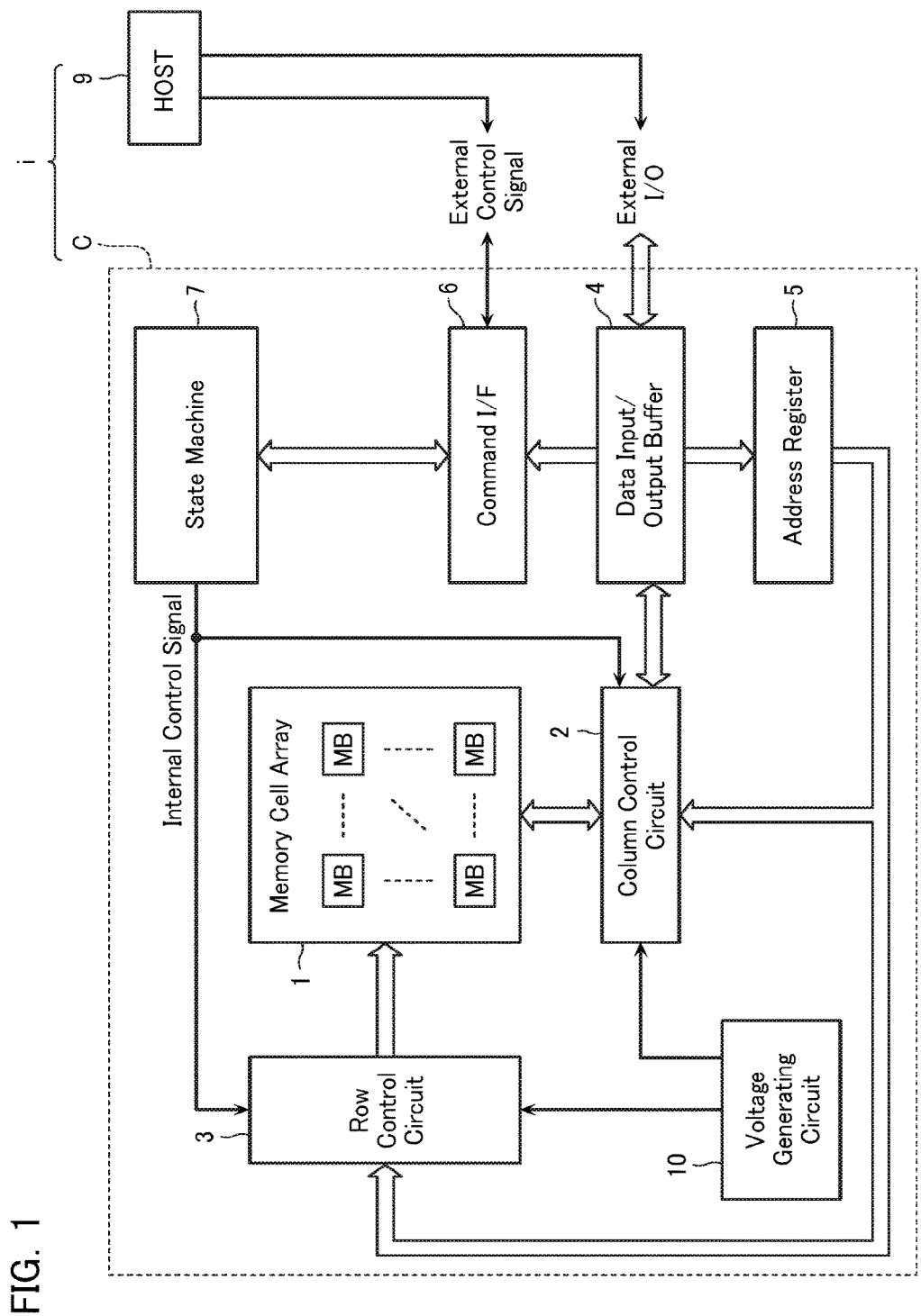
FIG. 1 is a block diagram of a semiconductor memory device according to a first embodiment.

FIG. 1 is a block diagram of a semiconductor memory device according to a first embodiment. Note that the semiconductor memory device referred to herein means, for example, the likes of a chip C storing user data or an electronic device i (for example, a smartphone, a mobile phone, a tablet terminal, a music player, a wearable terminal, and so on) installed with this chip C. Moreover, user data refers to, for example, data expressing contents (a character string, a sound, an image, a moving picture, and so on) utilized by a user, and is expressed by a combination of "0"s and "1"s.

The electronic device i comprises: the chip C; and a host 9 controlling this chip C. The chip C comprises: a memory cell array 1; and a column control circuit 2, a row control circuit 3, a data input/output buffer 4, an address register 5, a command interface 6, a state machine 7, and a voltage generating circuit 10 that control this memory cell array 1. The memory cell array 1 comprises a plurality of memory blocks MB. These memory blocks MB each record user data. The column control circuit 2 comprises an unillustrated sense amplifier, and performs read of user data, and so on. Moreover, the column control circuit 2, when performing write of user data, transfers a voltage to the memory cell array 1, according to inputted user data. The row control circuit 3 specifies a position for performing read or write of user data in the memory cell array 1, according to inputted address data. The data input/output buffer 4 performs input/output control of user data, address data, and command data. The address register 5 stores address data and supplies the address data to the column control circuit 2 and the row control circuit 3. The state machine 7 receives an external control signal from the host 9, via the command interface 6, and inputs an internal control signal to the column control circuit 2 and the row control circuit 3. The voltage generating circuit 10 generates a voltage and supplies the voltage to the column control circuit 2 and the row control circuit 3.

Figure 2:
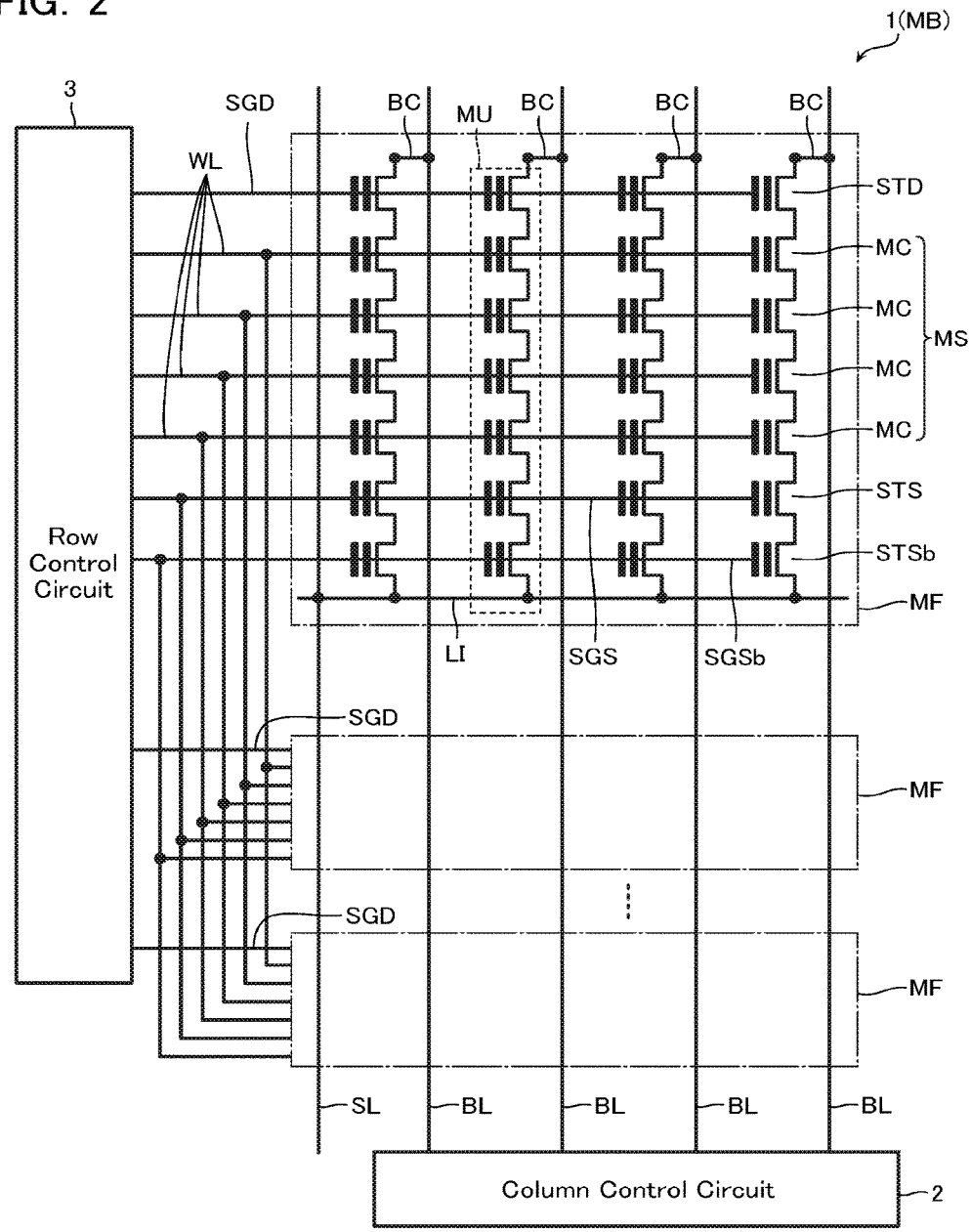
FIG. 2 is a circuit diagram showing a configuration of part of the same semiconductor memory device.

FIG. 2 is an equivalent circuit diagram showing a configuration of the memory block MB configuring the memory cell array 1. The memory block MB is connected to the column control circuit 2 via a bit line BL, to the row control circuit 3 via a word line WL, and to an unillustrated source line driver via a source line SL. Note that for convenience of description, in FIG. 2, part of the configuration is omitted.

The memory block MB comprises a plurality of memory fingers MF. The memory finger MF comprises a plurality of memory units MU. One ends of these plurality of memory units MU are each connected to one of the bit lines BL via a bit line contact BC. Moreover, the other ends of these plurality of memory units MU are each connected to the source line SL via a common source line contact LI. The memory unit MU comprises a drain side select gate transistor STD, a memory string MS, a source side select gate transistor STS, and a lowermost layer source side select gate transistor STSb that are connected in series between the bit line contact BC and the source line contact LI.

The memory string MS comprises a plurality of memory cells MC connected in series. The memory cell MC is a field effect transistor that comprises: a semiconductor layer functioning as a channel body; a gate insulating layer capable of accumulating a charge; and a control gate electrode, and stores a one-bit portion or a multiple-bit portion of data configuring user data. A threshold voltage of the memory cell MC changes according to a charge amount in the gate insulating layer. Note that the control gate electrodes of the plurality of memory cells MC belonging to an identical memory string MS have the word lines WL respectively connected thereto. The word line WL is provided commonly for all of the memory strings MS in the memory block MB.

The drain side select gate transistor STD, the source side select gate transistor STS, and the lowermost layer source side select gate transistor STSb are field effect transistors that comprise: a semiconductor layer functioning as a channel body; and a control gate electrode. Connected to the plurality of drain side select gate transistors STD belonging to an identical memory finger MF is a common drain side select gate line SGD. Moreover, connected to the control gate electrodes of the pluralities of source side select gate transistors STS and lowermost layer source side select gate transistors STSb belonging to an identical memory block MB are, respectively, a common source side select gate line SGS and a common lowermost layer source side select gate line SGSb.

Note that in the description below, the lowermost layer source side select gate transistor STSb, the source side select gate transistor STS, and the drain side select gate transistor STD will sometimes simply be called select gate transistors (STSb, STS, and STD). Moreover, the lowermost layer source side select gate line SGSb, the source side select gate line SGS, and the drain side select gate line SGD will sometimes simply be called select gate lines (SGSb, SGS, and SGD).

Figure 3:
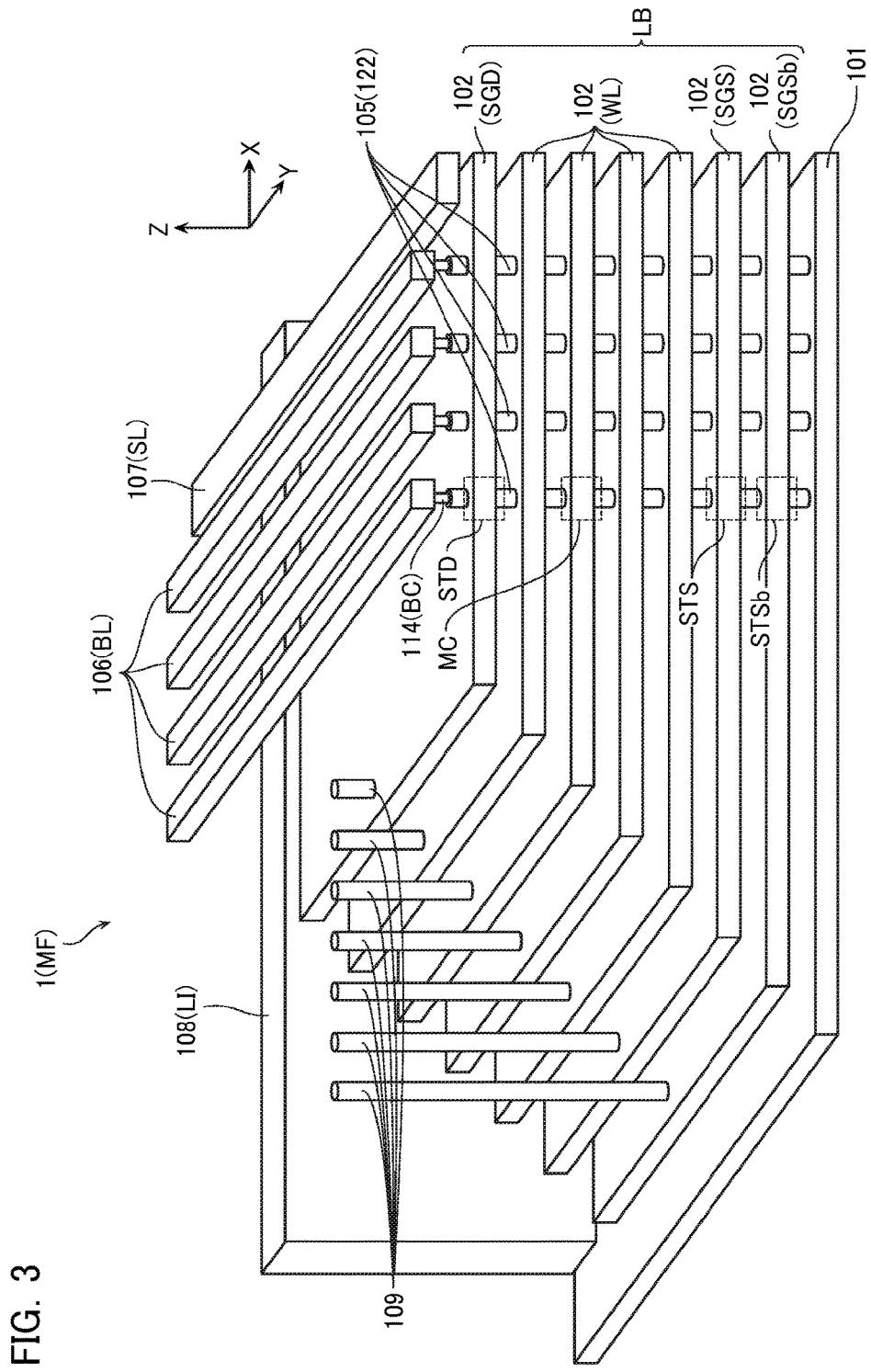
FIG. 3 is a perspective view showing a configuration of part of the same semiconductor memory device.

FIG. 3 is a schematic perspective view showing a configuration of part of the memory finger MF. Note that FIG. 3 explains a three-dimensional structure of a wiring line or the memory cell MC, and so on, and does not illustrate an inter-layer insulating layer provided between the wiring lines, and so on. In addition, FIG. 3 is illustrated for explanation, and a specific configuration may be appropriately changed. Moreover, in the description below, a certain direction parallel to an upper surface of a substrate 101 is assumed to be an X direction, a direction parallel to the upper surface of the substrate 101 and perpendicular to the X direction is assumed to be a Y direction, and a direction perpendicular to the upper surface of the substrate 101 is assumed to be a Z direction. The description below exemplifies the case where the first direction matches the Z direction, but the first direction need not match the Z direction.

The memory finger MF comprises: the substrate 101; a stacked body LB provided above the substrate 101; and a substantially circular column-shaped memory columnar body 105 whose side surface is covered by the stacked body LB.

The substrate 101 is a semiconductor substrate configured from the likes of monocrystalline silicon (Si), for example. The substrate 101 comprises a double well structure that includes an N type impurity layer on an upper surface of a semiconductor substrate and that further includes a P type impurity layer in this N type impurity layer, for example.

The stacked body LB includes a plurality of first conductive layers 102 stacked above the substrate 101. These first conductive layers 102 respectively function as the word line WL and control gate electrode of the memory cell MC, or as the select gate lines (SGSb, SGS, and SGD) and control gate electrodes of the select gate transistors (STSb, STS, and STD). The first conductive layer 102 is configured from a conductive layer of the likes of tungsten (W), for example. The first conductive layer 102 extends in the X direction. In addition, each of the first conductive layers 102 is connected to the row control circuit 3 (FIGS. 1 and 2) via a contact 109 extending in the Z direction. Note that the contact 109 is configured from a conductive layer of the likes of tungsten (W).

The memory columnar body 105 has a circular columnar shape extending in the Z direction and, along with the stacked body LB, configures the memory string MS, and so on. That is, an intersection of the first conductive layer 102 and the memory columnar body 105 functions as the memory cell MC or the select gate transistors (STSb, STS, and STD). The memory columnar body 105 includes a semiconductor layer 122 extending in the Z direction. The semiconductor layer 122 faces the plurality of first conductive layers 102 and functions as a channel body of the memory cell MC and the select gate transistors (STSb, STS, and STD). A lower end of the semiconductor layer 122 is electrically connected to a conductive layer 108 functioning as the source line contact LI, via the substrate 101. The conductive layer 108 is electrically connected to the unillustrated source line driver via a conductive layer 107 functioning as the source line SL. An upper end of the semiconductor layer 122 is electrically connected to a conductive layer 114 functioning as the bit line contact BC. The conductive layer 114 is electrically connected to the column control circuit 2 (FIGS. 1 and 2) via a conductive layer 106 functioning as the bit line BL. Note that the conductive layer 106, the conductive layer 107, and the conductive layer 114 are configured from a conductive layer of the likes of tungsten (W). Moreover, the conductive layer 106 and the conductive layer 107 are arranged in plurality in the X direction and extend in the Y direction. The conductive layer 108 comprises a substantially plate-like shape extending in the X direction and the Z direction along a side surface of the stacked body LB, and is connected at its lower surface to the substrate 101. The conductive layers 114 extend in the Z direction are each connected to one semiconductor layer 122 and one conductive layer 106.

Figure 4:
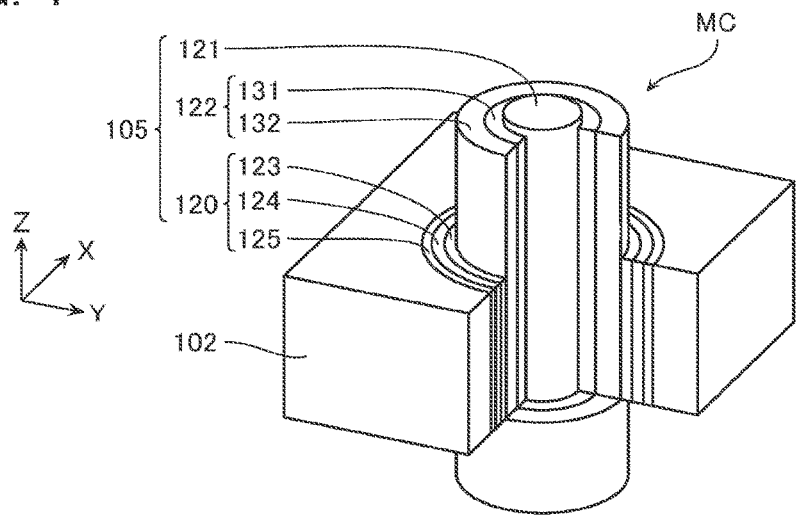
FIG. 4 is a perspective view showing a configuration of part of the same semiconductor memory device.

FIG. 4 is a schematic perspective view showing a configuration of the memory cell MC. Note that the select gate transistors (STSb, STS, and STD) may also be configured similarly to the memory cell MC.

The memory cell MC is provided at an intersection of the first conductive layer 102 and the memory columnar body 105. The memory columnar body 105 comprises: a circular column-shaped core insulating layer 121 extending in the Z direction; the semiconductor layer 122 covering a side surface of the core insulating layer 121; and a gate insulating layer 120 covering a side surface of the semiconductor layer 122. The semiconductor layer 122 comprises: a first semiconductor layer 131 covering the side surface of the core insulating layer 121; and a second semiconductor layer 132 covering a side surface of the first semiconductor layer 131. The gate insulating layer 120 comprises: a tunnel insulating layer 123 covering the side surface of the semiconductor layer 122; a charge accumulation layer 124 covering a side surface of the tunnel insulating layer 123; and a block insulating layer 125 covering a side surface of the charge accumulation layer 124.

The core insulating layer 121 is configured from an insulating layer of the likes of silicon oxide ($SiO_2$), for example. The semiconductor layer 122 is configured from a semiconductor layer of the likes of polysilicon, for example, and is formed in a substantially cylindrical shape extending in the Z direction along the side surface of the core insulating layer 121. The gate insulating layer 120 is provided between the first conductive layer 102 and the semiconductor layer 122, and is formed in a substantially cylindrical shape extending in the Z direction along the side surface of the semiconductor layer 122. The tunnel insulating layer 123 is configured from an insulating layer of the likes of silicon oxide ($SiO_2$), for example. The charge accumulation layer 124 is configured from an insulating layer capable of accumulating a charge, of the likes of silicon nitride ($Si_3N_4$), for example. The block insulating layer 125 is configured from an insulating layer of the likes of silicon oxide ($SiO_2$) or alumina ($Al_2O_3$), for example.

Figure 5:
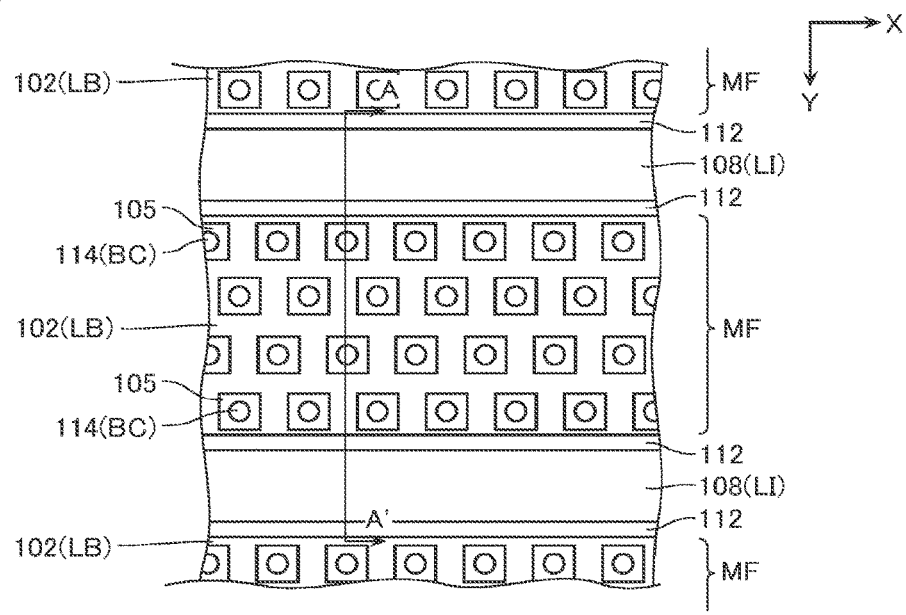
FIG. 5 is a plan view showing a configuration of part of the same semiconductor memory device.
Figure 6:
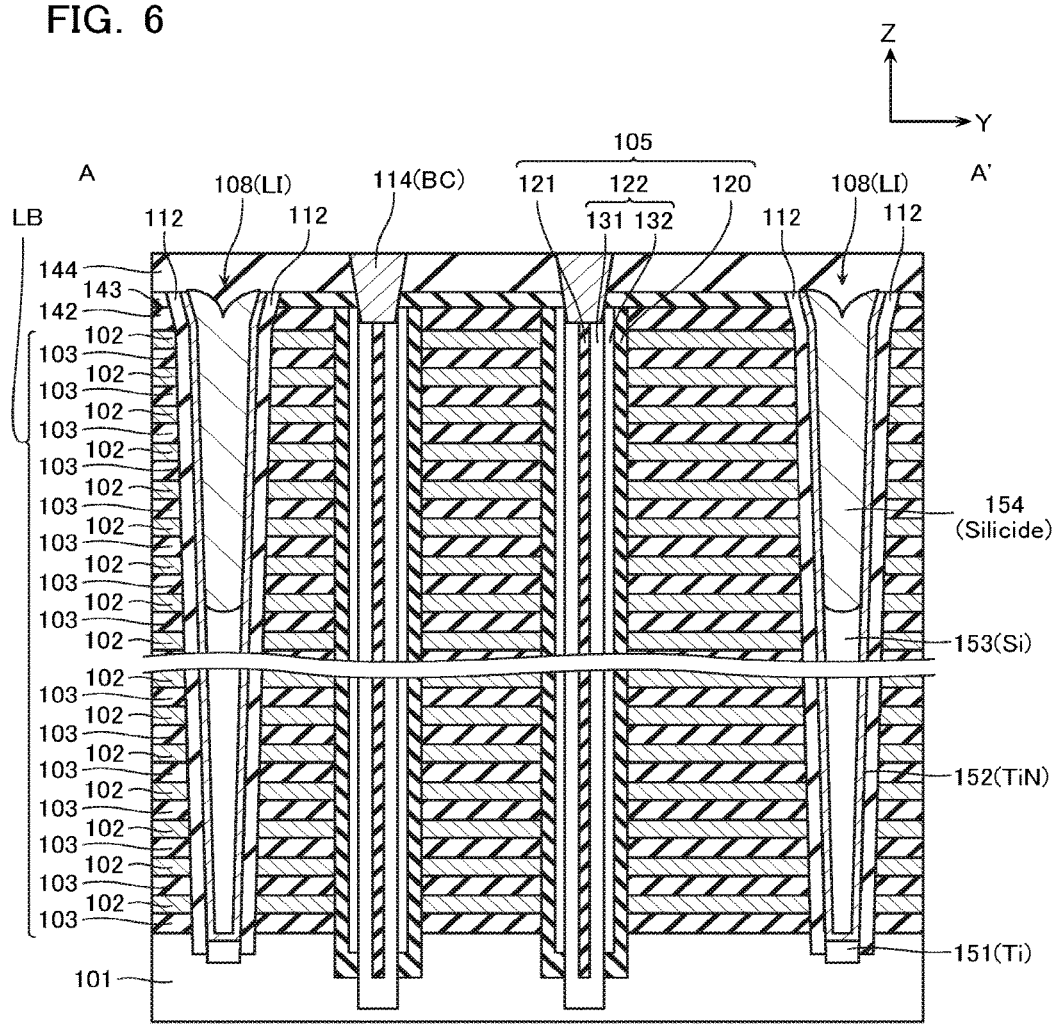
FIG. 6 is a cross-sectional view showing a configuration of part of the same semiconductor memory device.

FIGS. 5 and 6 are respectively a plan view and a cross-sectional view showing a configuration of part of the semiconductor memory device according to the first embodiment, and FIG. 6 shows a cross section of the portion indicated by the line AA' of FIG. 5.

As shown in FIG. 5, the semiconductor memory device according to the present embodiment comprises a plurality of the memory fingers MF and the conductive layers 108 arranged alternately in the Y direction. In addition, a second inter-layer insulating layer 112 is provided between the memory finger MF and the conductive layer 108. The memory finger MF, the conductive layer 108, and the second inter-layer insulating layer 112 each extend in the X direction. The memory fingers MF each comprise a plurality of the memory columnar bodies 105 arranged in a staggered manner.

As shown in FIG. 6, the stacked body LB, in addition to including the plurality of first conductive layers 102, includes also a first inter-layer insulating layer 103 provided between these first conductive layers 102. An upper surface of the stacked body LB is covered by an inter-layer insulating layer 142. The memory columnar body 105 penetrates the stacked body LB and the inter-layer insulating layer 142 to extend in the Z direction. Upper surfaces of the inter-layer insulating layer 142 and the memory columnar body 105 are covered by an inter-layer insulating layer 143. Moreover, side surfaces of the stacked body LB, the inter-layer insulating layer 142, and the inter-layer insulating layer 143 are covered by the second inter-layer insulating layer 112. In addition, the conductive layer 108 extending in the Z direction is provided between a pair of the stacked bodies LB adjacent in the Y direction. The conductive layer 108 is formed in an inverted tapered shape where its width in the Y direction gradually broadens from its lower end to its upper end. Moreover, upper surfaces of the inter-layer insulating layer 143, the second inter-layer insulating layer 112, and the conductive layer 108 are covered by an inter-layer insulating layer 144. The conductive layer 114 penetrates this inter-layer insulating layer 144 and the inter-layer insulating layer 143 to contact an upper end of the memory columnar body 105. Note that the first inter-layer insulating layer 103, the inter-layer insulating layers 142, 143, and 144, and the second inter-layer insulating layer 112 are configured from an insulating layer of the likes of silicon oxide ($SiO_2$), for example.

Now, the conductive layer 108 (LI) according to the present embodiment comprises: a first silicide layer 151 provided on the upper surface of the substrate 101; a barrier metal layer 152 provided on an upper surface of this first silicide layer 151; a silicon layer 153 provided on an upper surface of this barrier metal layer 152; and a second silicide layer 154 provided on an upper surface of this silicon layer 153.

The first silicide layer 151 contacts the upper surface of the substrate 101 and a side surface at a lower end of the second inter-layer insulating layer 112. The first silicide layer 151 is configured from titanium silicide ($TiSi_x$), for example.

The barrier metal layer 152 covers the upper surface of the first silicide layer 151 and the side surface of the second inter-layer insulating layer 112. The barrier metal layer 152 is configured from titanium nitride ($TiN_x$), for example.

The silicon layer 153 has its lower surface and side surface covered by the barrier metal layer 152. Moreover, the upper surface of the silicon layer 153 is positioned more downwardly than an upper end of the barrier metal layer 152. The silicon layer 153 is configured from polysilicon (Si), for example.

The second silicide layer 154 is connected to the upper surface of the silicon layer 153 and has its side surface covered by the barrier metal layer 152. Moreover, a recess is formed in an upper surface of the second silicide layer 154. Moreover, a lower surface (a boundary portion with the silicon layer 153) of the second silicide layer 154 is a downwardly convex curved surface. The second silicide layer 154 is configured from the likes of tantalum silicide (TaSi$_x$), tungsten silicide (WSi$_x$), or platinum silicide (PtSi$_x$), for example.

[Method of Manufacturing]

FIGS. 7 to 23 are cross-sectional views for explaining a method of manufacturing a semiconductor memory device according to the present embodiment, and each show a cross section corresponding to FIG. 6.

Figure 7:
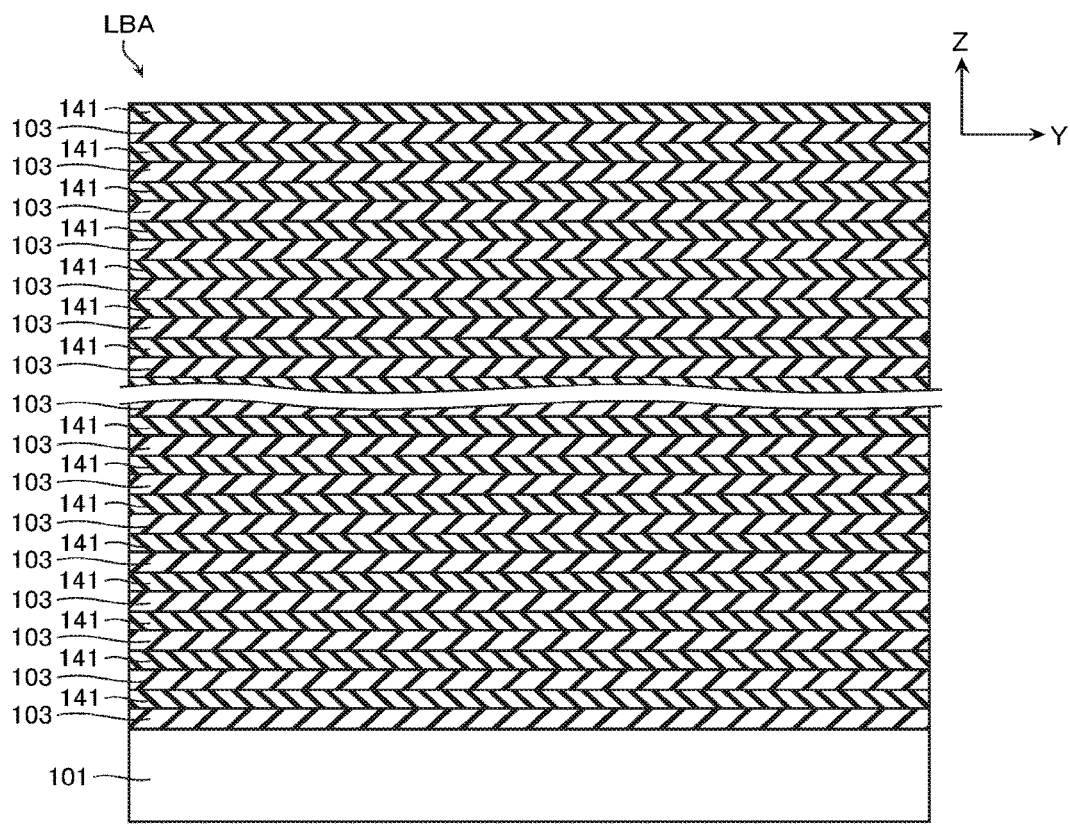
FIGS. 7 to 23 are cross-sectional views for explaining a method of manufacturing the same semiconductor memory device.

As shown in FIG. 7, in the same method of manufacturing, a plurality of the first inter-layer insulating layers 103 and sacrifice layers 141 (first layers) are stacked alternately on the substrate 101 to form a stacked body LBA. The first inter-layer insulating layer 103 is configured from an insulating layer of the likes of silicon oxide (SiO$_2$), for example. The sacrifice layer 141 is configured from the likes of silicon nitride (Si$_3$N$_4$), for example. Formation of the first inter-layer insulating layer 103 and the sacrifice layer 141 is performed by a method such as CVD (Chemical Vapor Deposition), for example.

Figure 8:
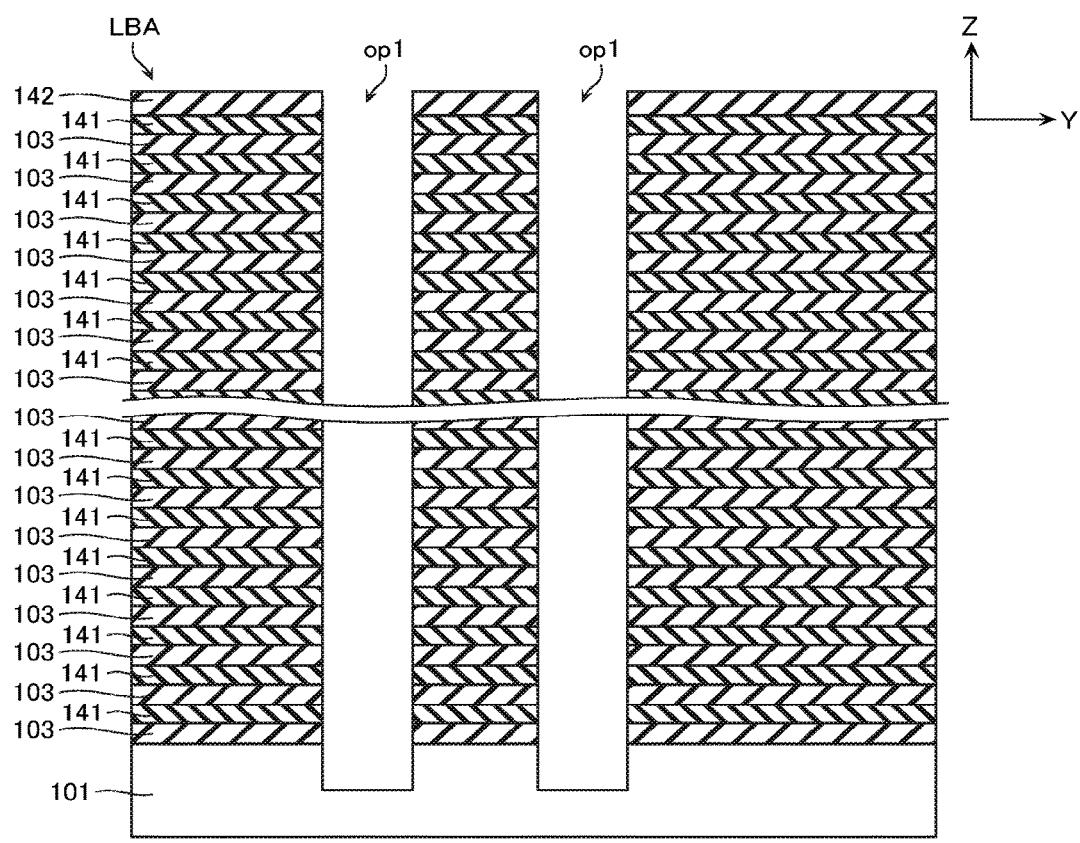

Next, as shown in FIG. 8, an opening op1 is formed in the stacked body LBA. The opening op1 is a through hole that extends in the Z direction and penetrates the plurality of first inter-layer insulating layers 103 and sacrifice layers 141 stacked on the substrate 101 to expose the upper surface of the substrate 101. The opening op1 is formed by, for example, forming on an upper surface of the stacked body LBA the inter-layer insulating layer 142 having an opening in a portion thereof corresponding to the opening op1, and performing RIE (Reactive Ion Etching) using this inter-layer insulating layer 142 as a mask.

Figure 9:
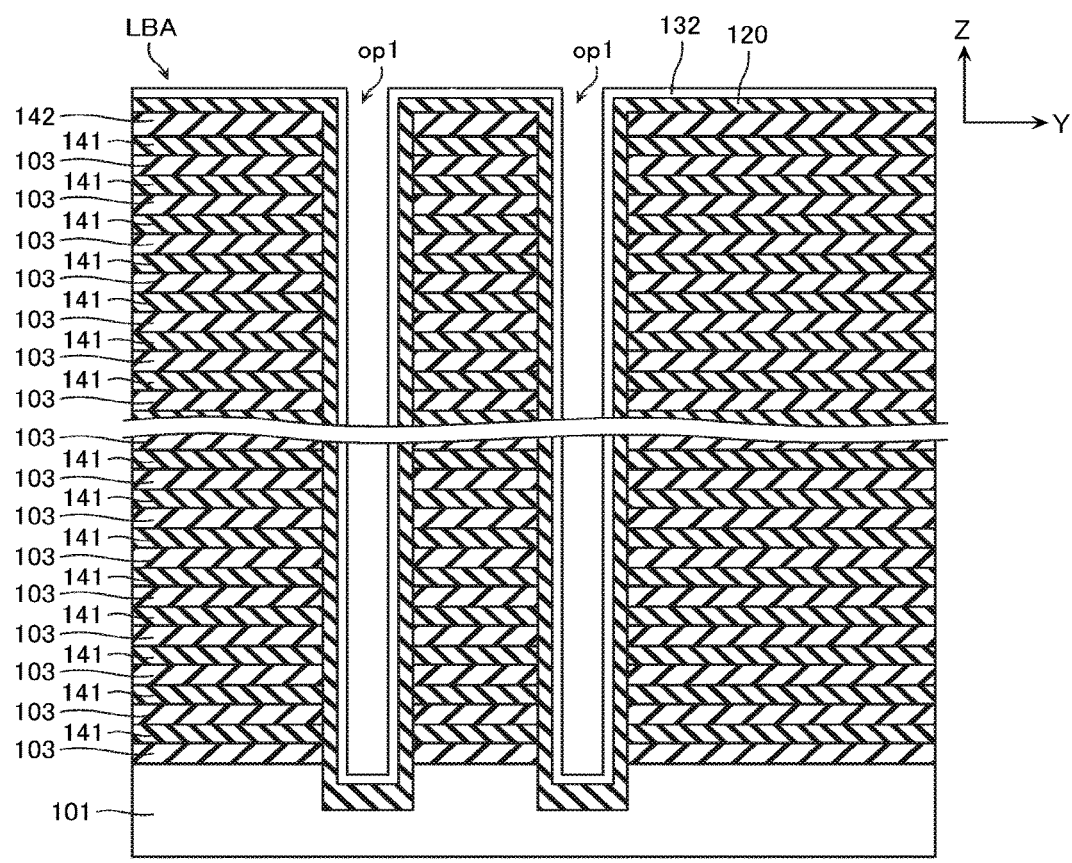

Next, as shown in FIG. 9, the gate insulating layer 120 and the second semiconductor layer 132 are sequentially formed on a bottom surface and an inner wall of the opening op1 and on the upper surface of the inter-layer insulating layer 142. The gate insulating layer 120 is configured from a stacked film of silicon oxide (SiO$_2$), silicon nitride (Si$_3$N$_4$), and silicon oxide (SiO$_2$), for example. The second semiconductor layer 132 is configured from amorphous state silicon (Si), for example. Note that formation of the gate insulating layer 120 and the second semiconductor layer 132 are performed by a method such as CVD, for example.

Figure 10:
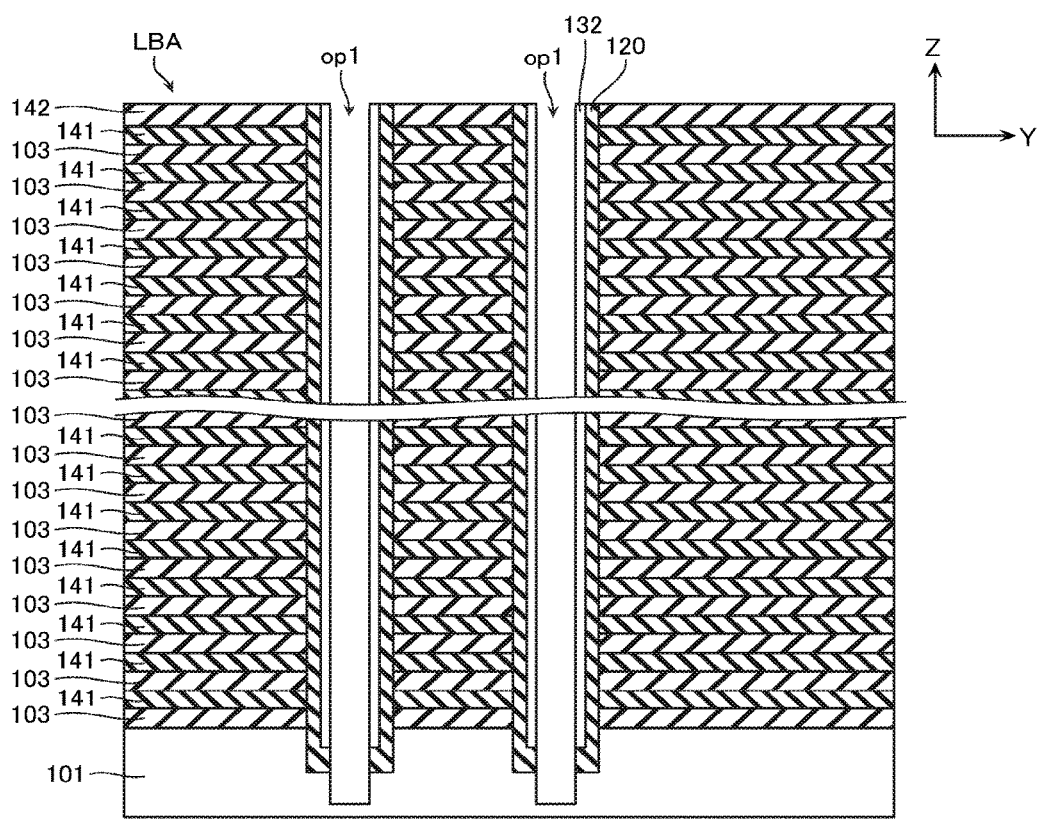

Next, as shown in FIG. 10, portions of the gate insulating layer 120 and the second semiconductor layer 132 covering the bottom surface of the opening op1 and covering the upper surface of the inter-layer insulating layer 142 are removed. This step is performed by the likes of RIE, for example.

Figure 11:
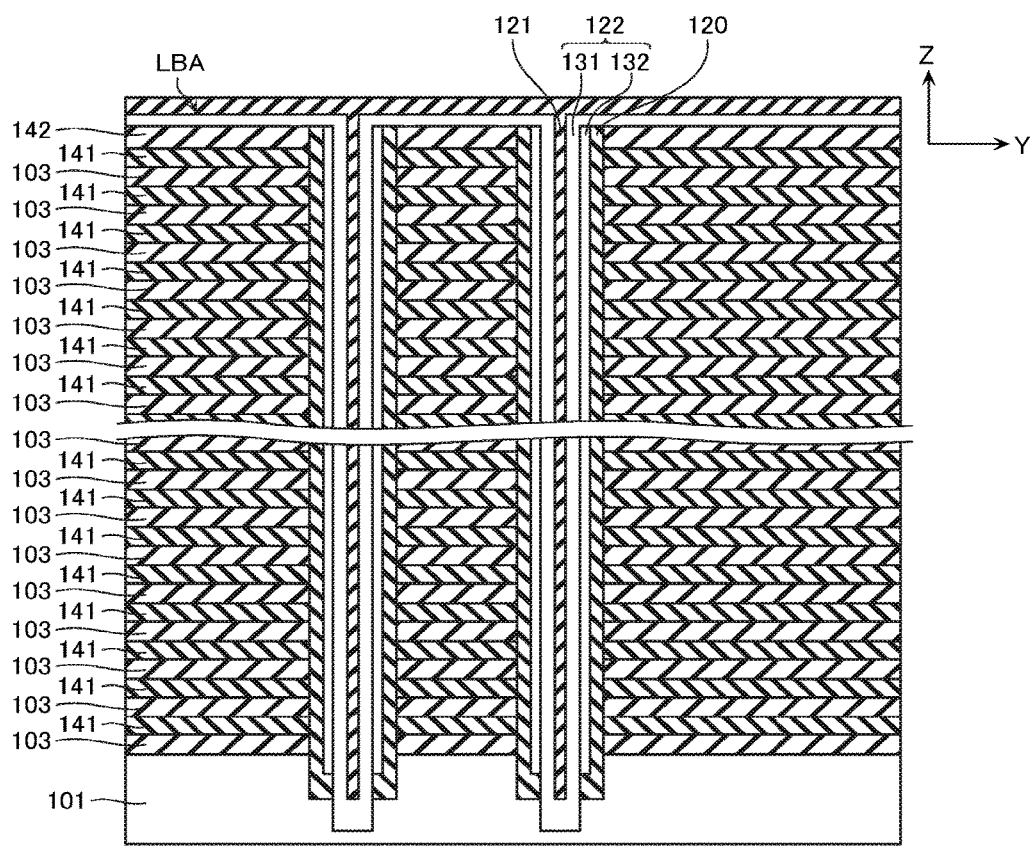

Next, as shown in FIG. 11, the first semiconductor layer 131 is formed on the bottom surface and inner wall of the opening op1 (the upper surface of the substrate 101 and side surface of the second semiconductor layer 132) and on the upper surface of the inter-layer insulating layer 142, and furthermore, the core insulating layer 121 is implanted. Formation of the first semiconductor layer 131 is performed by, for example, depositing amorphous state silicon (Si) by a method such as CVD. The core insulating layer 121 is formed by filling a liquid material inside the opening op1 and hardening this liquid material by heat treatment.

Figure 12:
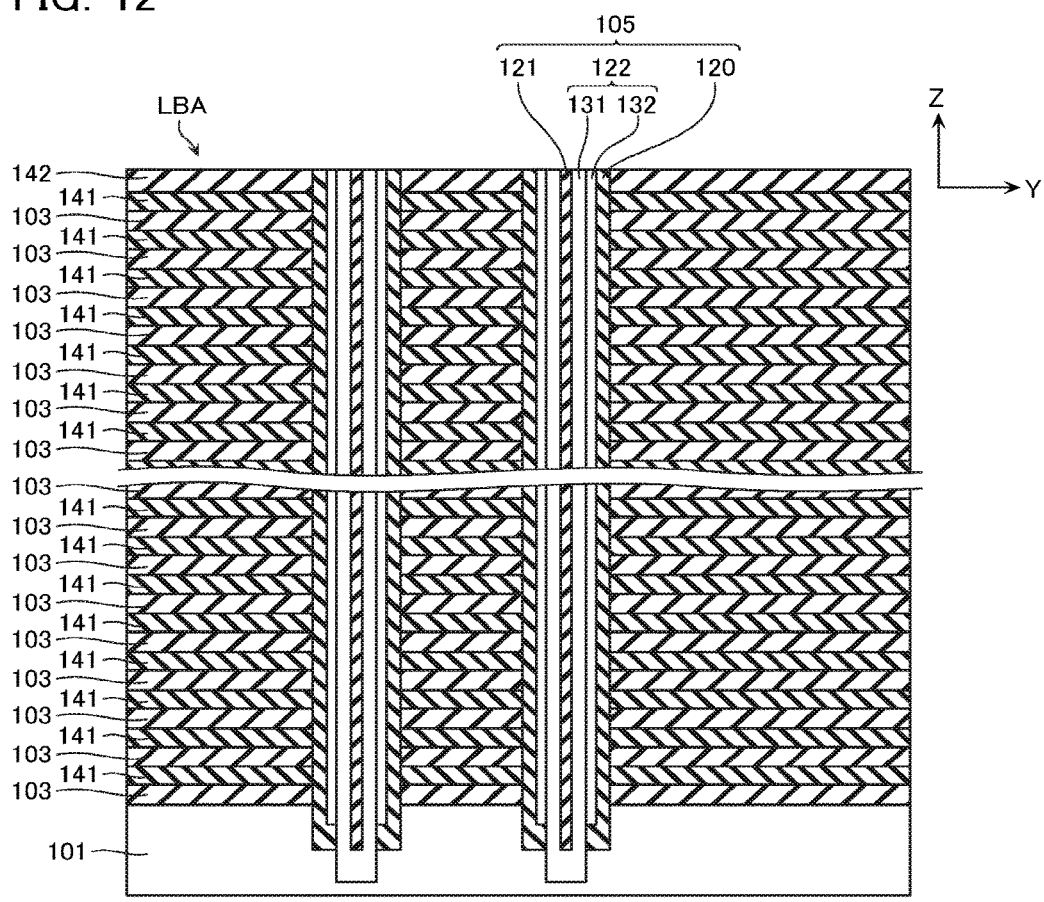

Next, as shown in FIG. 12, portions covering the upper surface of the inter-layer insulating layer 142, of the first semiconductor layer 131 and the core insulating layer 121, are removed. This step is performed by the likes of RIE, for example. Moreover, a crystalline structure in the first semiconductor layer 131 and the second semiconductor layer 132 is reformed from an amorphous structure to a polycrystalline structure, by heat treatment or the like. As a result, the memory columnar body 105 is formed.

Figure 13:
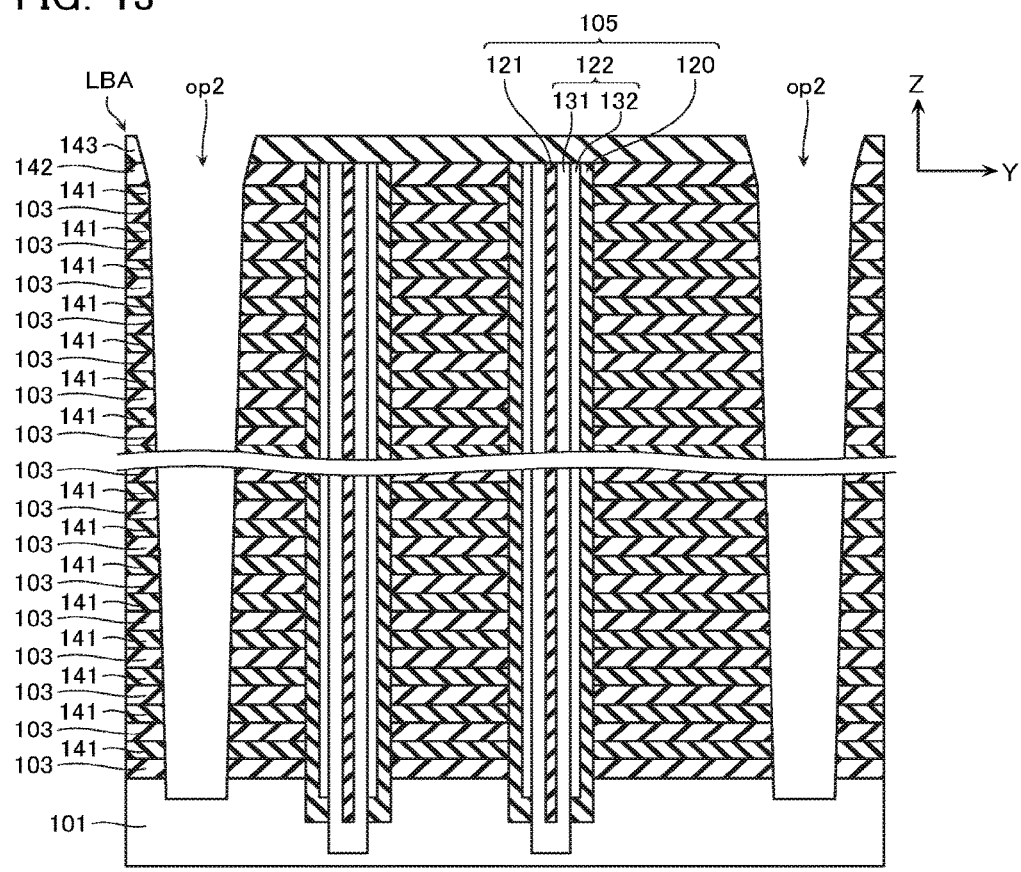

Next, as shown in FIG. 13, an opening op2 is formed in the stacked body LBA. The opening op2 is a trench that extends in the Z direction and the X direction, and penetrates the plurality of first inter-layer insulating layers 103 and sacrifice layers 141 stacked on the substrate 101 and divides these layers in the Y direction to expose the upper surface of the substrate 101. The opening op2 is formed by, for example, forming on the upper surface of the inter-layer insulating layer 142 the inter-layer insulating layer 143 having a trench in a portion thereof corresponding to the opening op2, and performing RIE using this inter-layer insulating layer 143 as a mask. Note that in the example shown in FIG. 13, the opening op2 is formed in an inverted tapered shape where its width in the Y direction gradually broadens from its lower end to its upper end.

Figure 14:
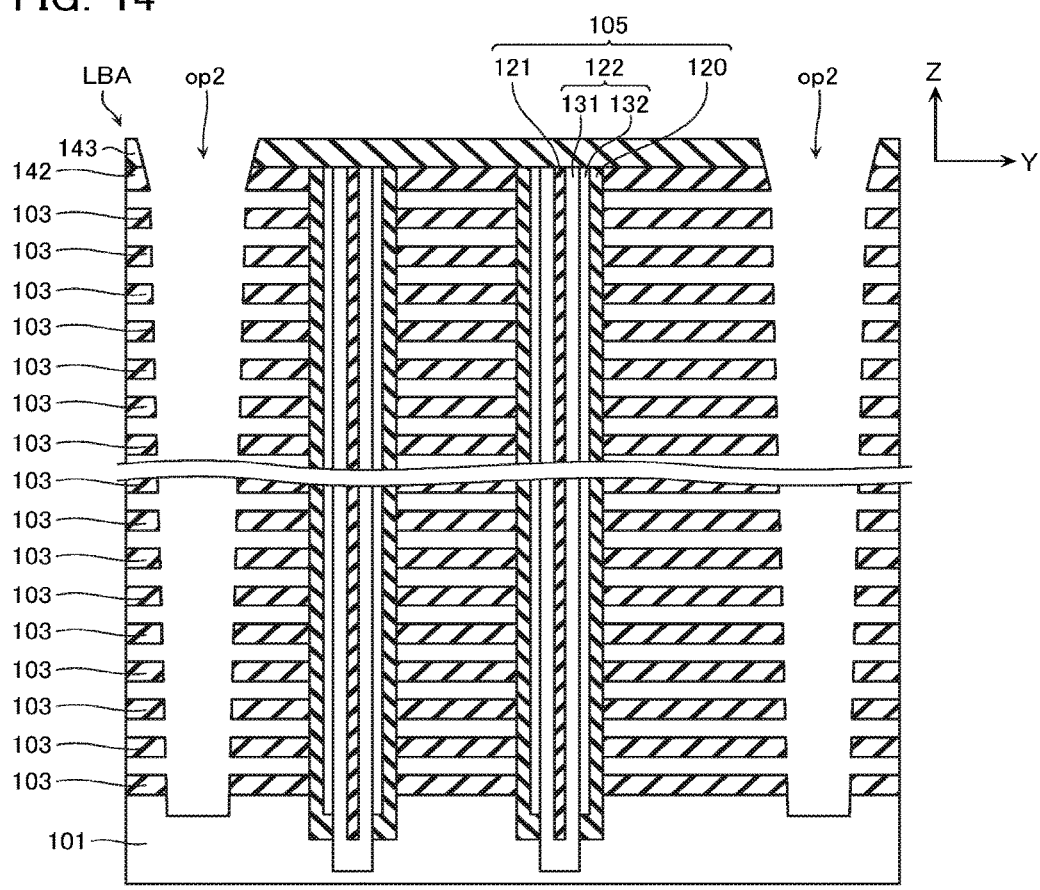

Next, as shown in FIG. 14, the sacrifice layer 141 is removed via the opening op2. The sacrifice layer 141 is removed by the likes of wet etching using phosphoric acid, for example.

Figure 15:
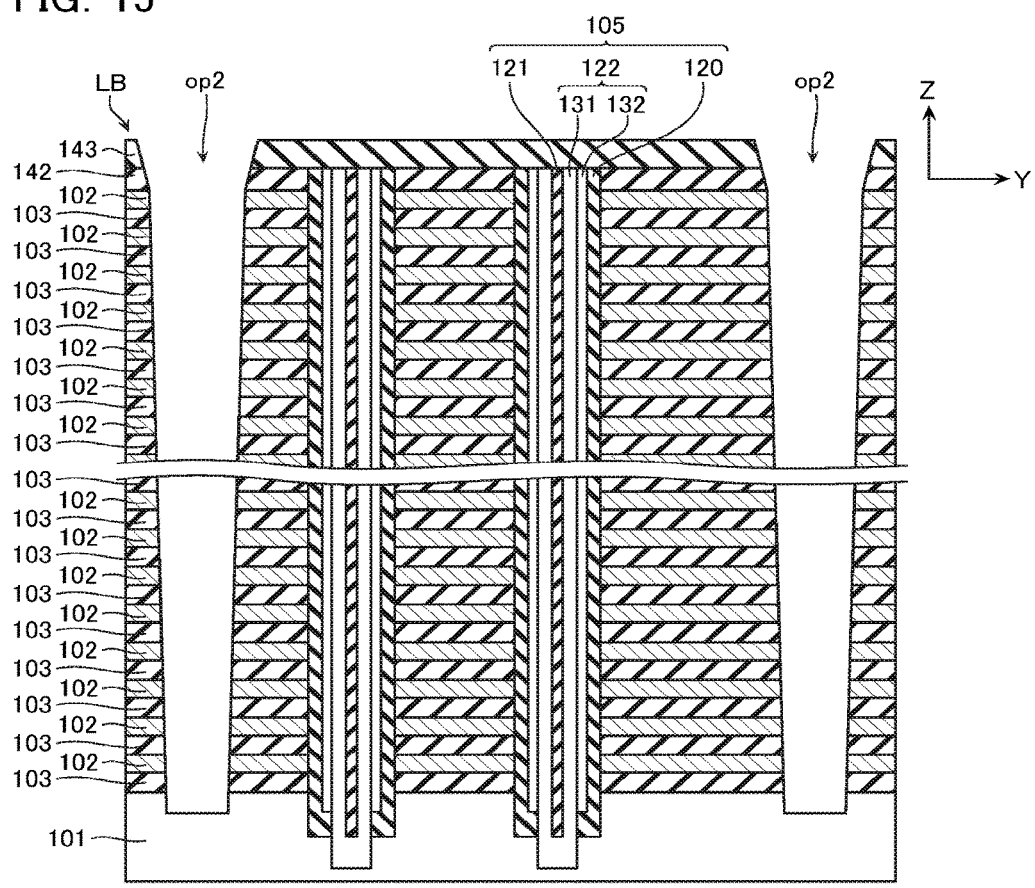

Next, as shown in FIG. 15, the first conductive layer 102 is formed. During formation of the first conductive layer 102, for example, the first conductive layer 102 is formed on an upper surface, lower surface, and side surface of the first inter-layer insulating layer 103 via the opening op2, and a portion formed on the side surface of the first inter-layer insulating layer 103, of the first conductive layer 102, is selectively removed. The first conductive layer 102 is formed by, for example, depositing the likes of tungsten (W) by a means such as CVD.

Figure 16:
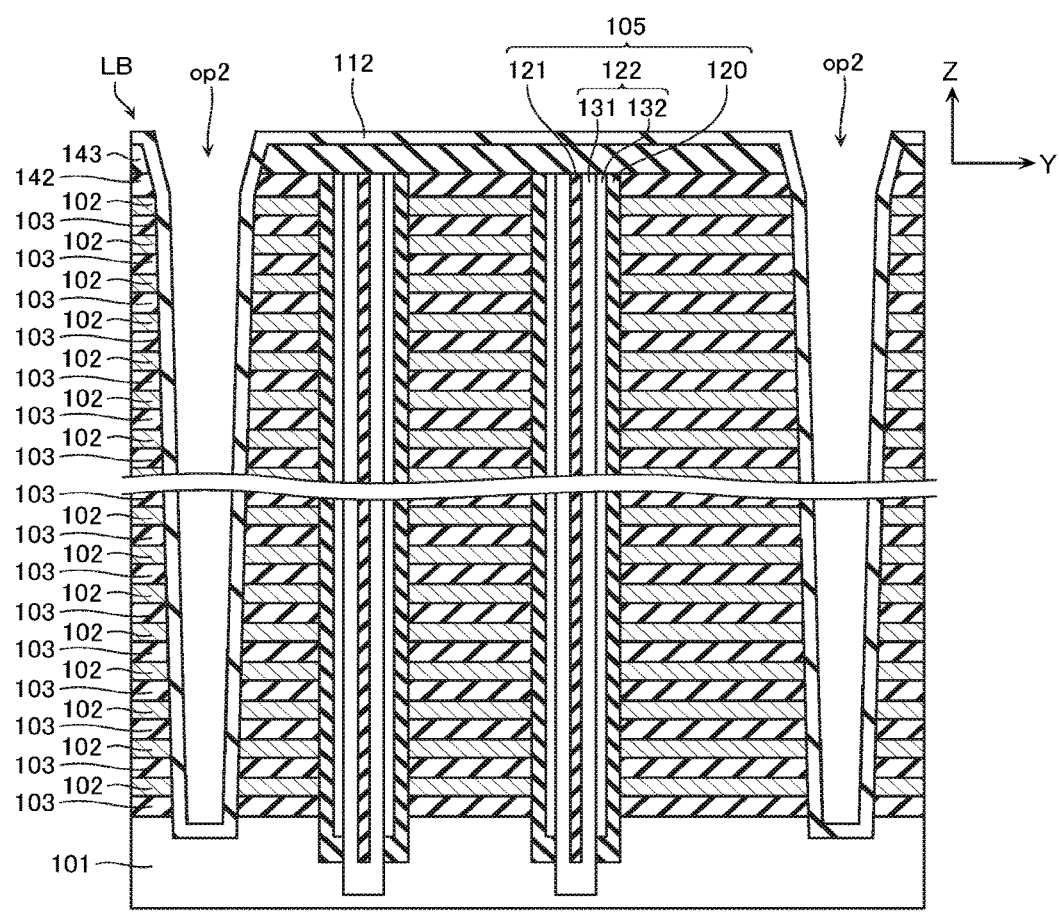

Next, as shown in FIG. 16, the second inter-layer insulating layer 112 is formed. The second inter-layer insulating layer 112 is formed by depositing the likes of silicon oxide (SiO$_2$), by a means such as CVD, on a bottom surface of the opening op2 (the upper surface of the substrate 101), on an inner wall of the opening op2 (side surfaces of the stacked body LB, the inter-layer insulating layer 142, and the inter-layer insulating layer 143), and on an upper surface of the inter-layer insulating layer 143.

Figure 17:
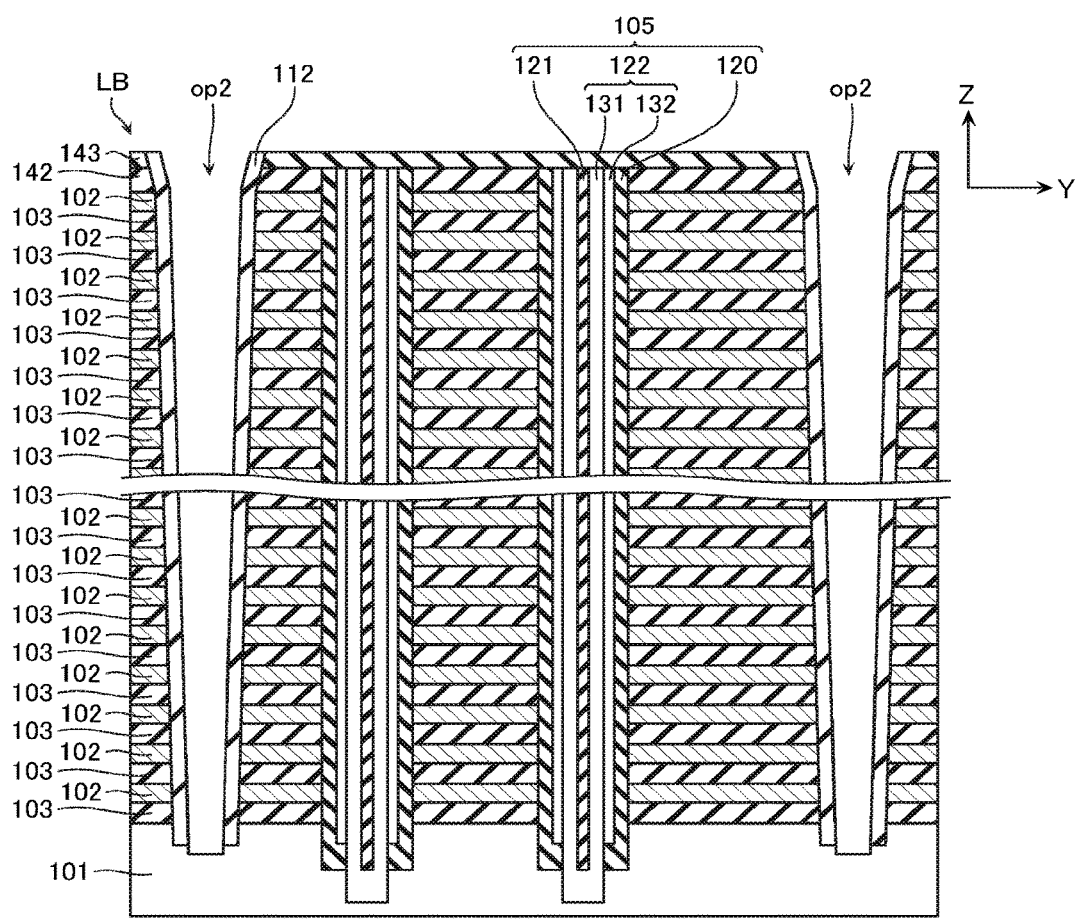

Next, as shown in FIG. 17, a portion covering the bottom surface of the opening op2 and a portion covering the upper surface of the inter-layer insulating layer 143, of the second inter-layer insulating layer 112, are removed. This step is performed by the likes of RIE, for example.

Figure 18:
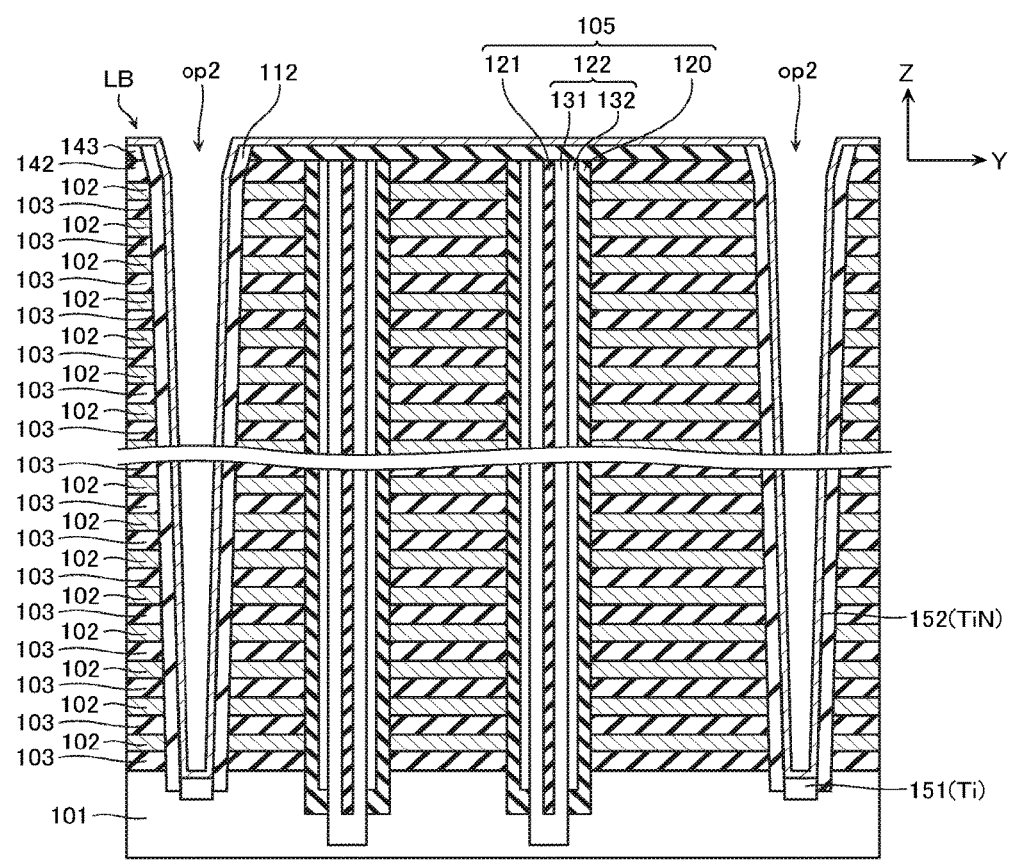

Next, as shown in FIG. 18, the first silicide layer 151 is formed on the upper surface of the substrate 101, and the barrier metal layer 152 is formed on the upper surface of this first silicide layer 151. The first silicide layer 151 is formed by, for example, depositing titanium (Ti), by a means such as CVD, on the bottom surface of the opening op2. Formation of the barrier metal layer 152 is performed by, for example, depositing titanium nitride (TiN$_x$), by a means such as CVD, on the upper surface of the first silicide layer 151, on a side surface of the second inter-layer insulating layer 112, and on the upper surface of the inter-layer insulating layer 143.

Figure 19:
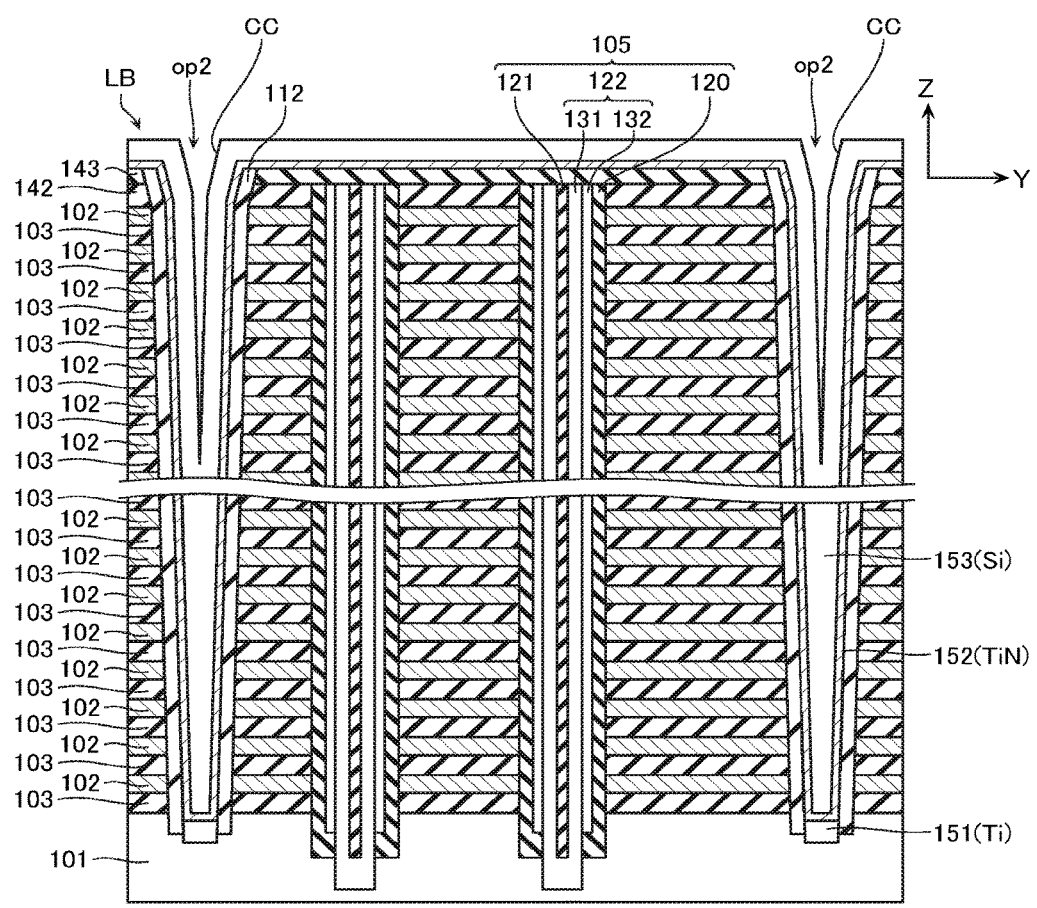

Next, as shown in FIG. 19, the silicon layer 153 is formed. Formation of the silicon layer 153 is performed by, for example, depositing amorphous state silicon (Si), by a means such as CVD, on the upper surface and side surface of the barrier metal layer 152. Note that the silicon layer 153 is formed thinly enough for the opening op2 not to be filled in. Therefore, a crevice CC is formed in the upper surface of the silicon layer 153, along the opening op2.

Figure 20:
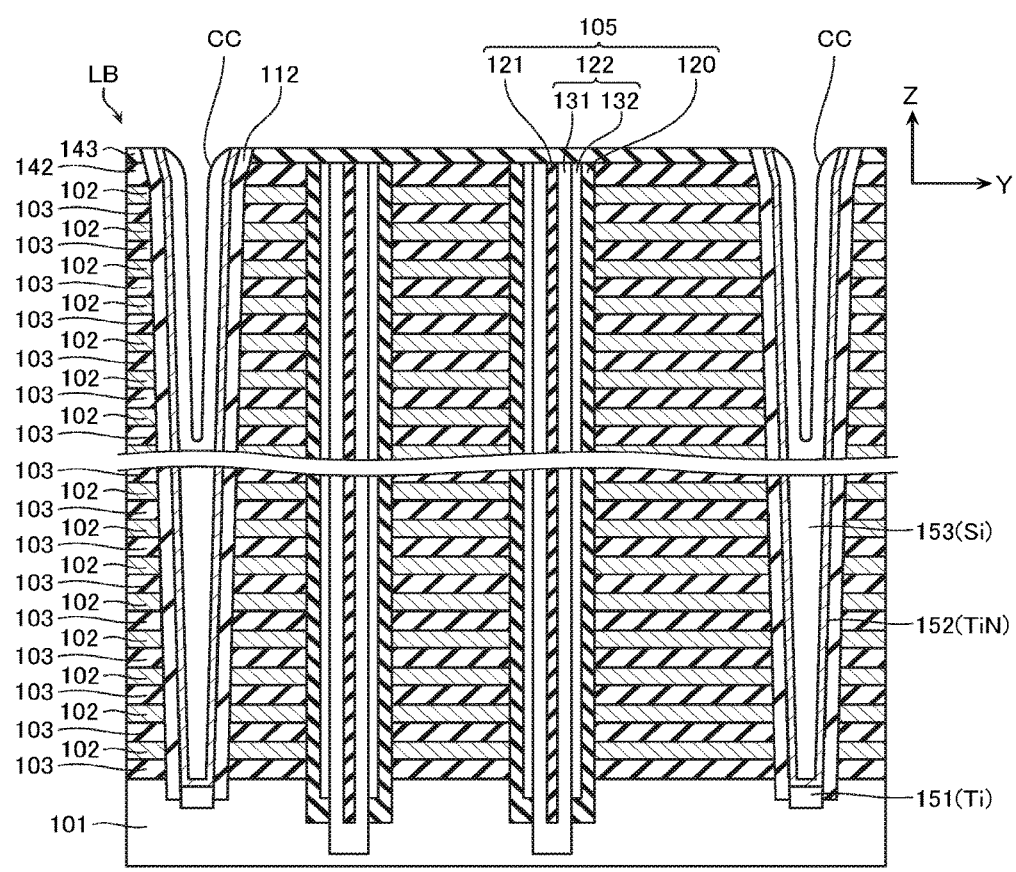

Next, as shown in FIG. 20, portions covering the upper surface of the inter-layer insulating layer 143, of the silicon layer 153 and the barrier metal layer 152, are removed. This step is performed by a means such as etching-back, for example. In this step, part of the silicon layer 153 is removed also inside the opening op2. As a result, a width in the Y direction of the crevice CC broadens.

Figure 21:
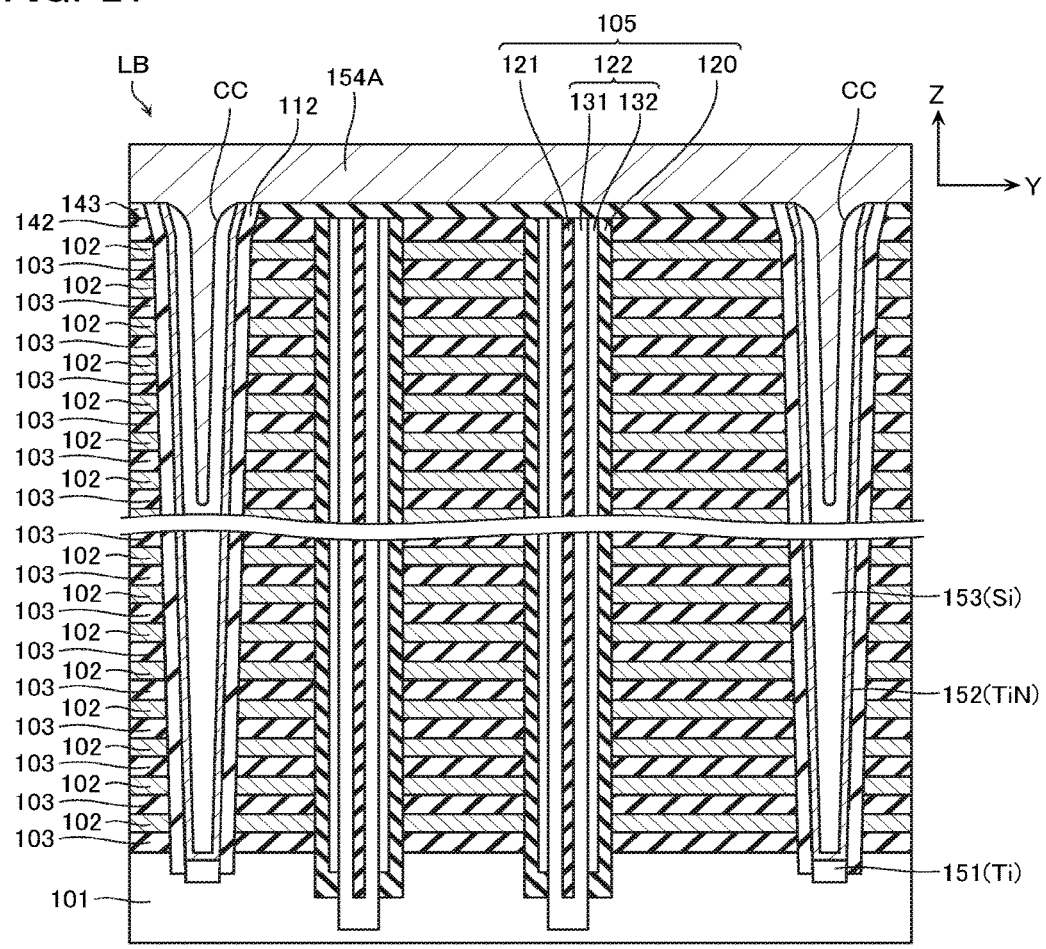

Next, as shown in FIG. 21, a metal layer 154A is formed on the upper surfaces of the inter-layer insulating layer 143 and the silicon layer 153. Formation of the metal layer 154A is performed by, for example, PVD (Physical Vapor Deposition) such as sputtering. Note that the metal layer 154A is formed also inside the crevice CC.

Figure 22:
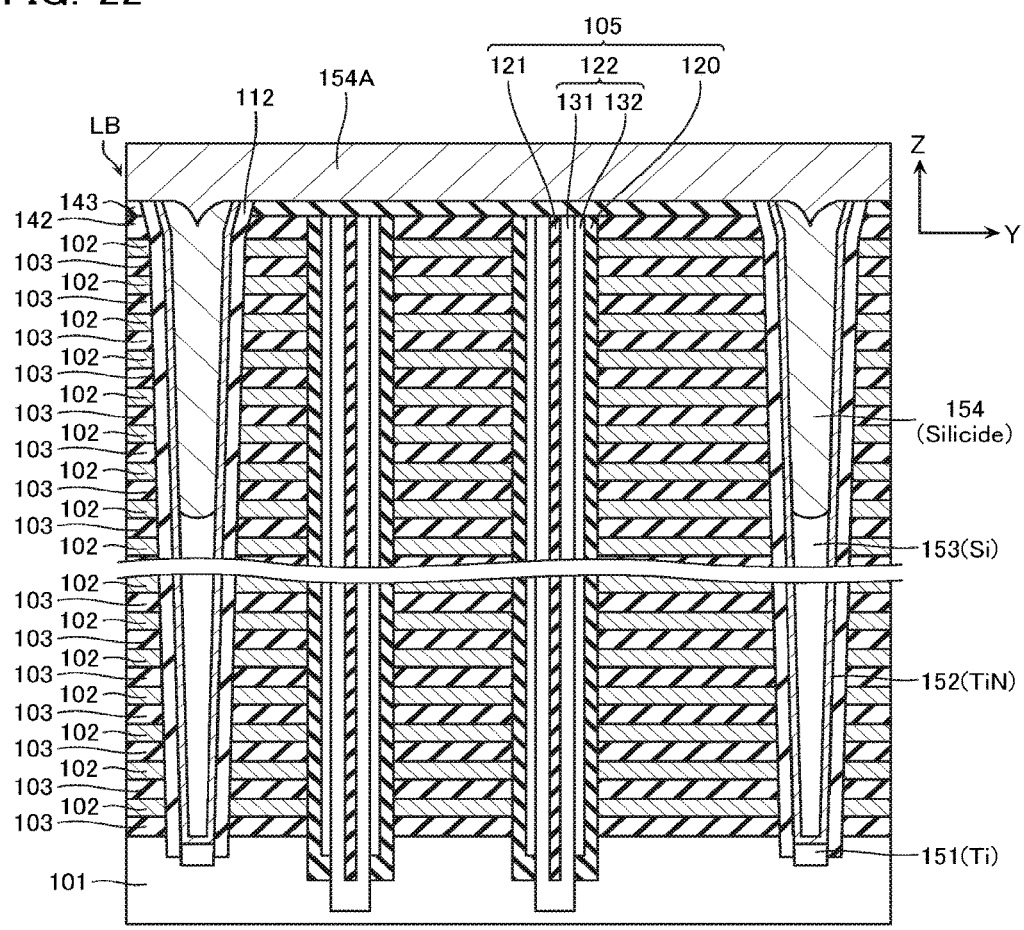

Next, as shown in FIG. 22, the second silicide layer 154 is formed. The second silicide layer 154 is formed by the likes of heat treatment, for example. When the likes of heat treatment is performed, metal atoms in the metal layer 154A diffuse in the silicon layer 153, moreover, silicon atoms in the silicon layer 153 diffuse in the metal layer 154A, from a contact surface between the silicon layer 153 and the metal layer 154A, whereby a metal silicide is formed.

Figure 23:
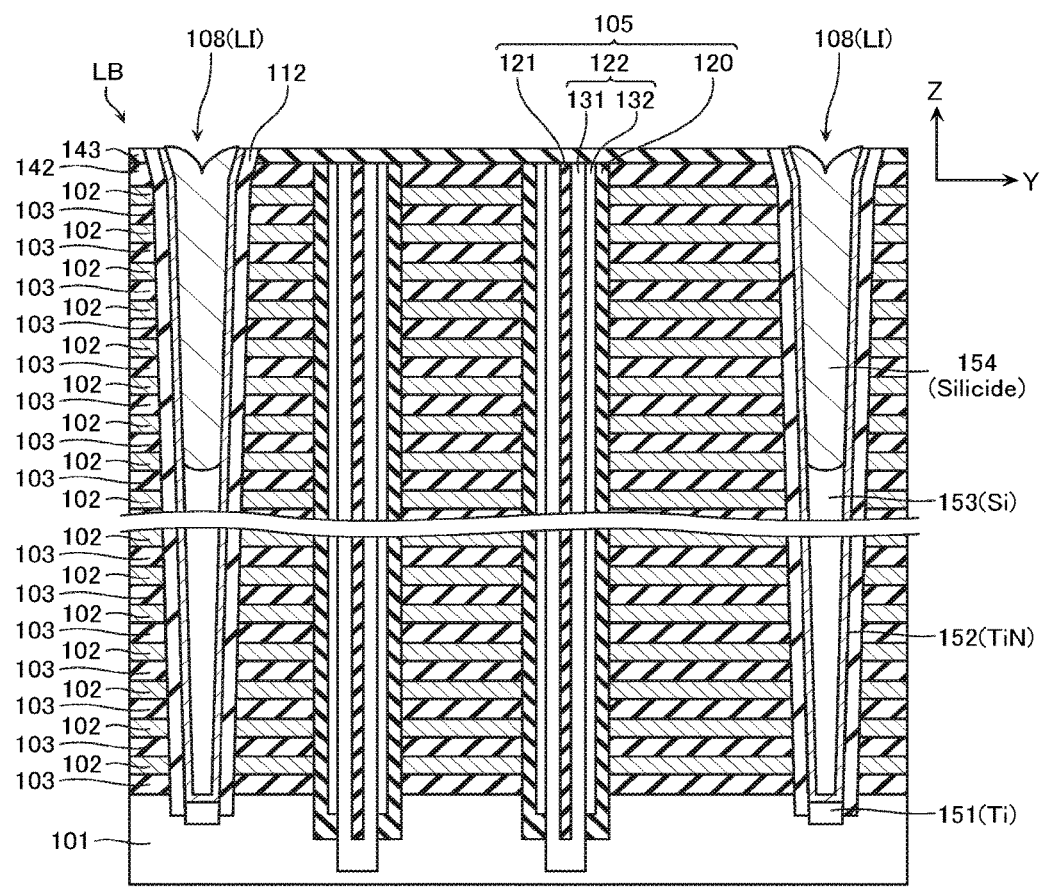

Next, as shown in FIG. 23, the metal layer 154A is removed by a means such as wet etching. As a result, the conductive layer 108 is formed.

Then, as shown in FIG. 6, the inter-layer insulating layer 144 is formed on the upper surfaces of the inter-layer insulating layer 143, the conductive layer 108, and the second inter-layer insulating layer 112, and the conductive layer 114 is formed, whereby a semiconductor memory device due to the method of manufacturing of the first embodiment is completed.

Advantages

Sometimes, when the conductive layer 108 is configured only from a metal such as tungsten (W), warping ends up occurring in the substrate 101. This is because thermal expansion coefficients differ between a material such as silicon (Si) used in the substrate 101 and a metal such as tungsten (W), and, after formation of the tungsten, a contraction stress on the substrate 101 ends up occurring.

In order to suppress such warping of the substrate 101, for example, it is conceivable to form part of the conductive layer 108 from a silicide. This is because a silicide has a smaller difference in thermal expansion coefficient between itself and the silicon (Si) configuring the substrate 101, compared to a metal material such as tungsten. Moreover, a material such as Ni silicide causes an expansion stress on the likes of silicon. Therefore, when the conductive layer 108 is formed from the likes of Ni silicide, contraction stress due to the tungsten (W) configuring the word line WL is offset by expansion stress due to the Ni silicide configuring the conductive layer 108, and warping of the substrate 101 can be even more preferably reduced.

In order to form the conductive layer 108 from a silicide, it is only required to, for example, form amorphous state silicon (the silicon layer 153) inside the opening op2, form the metal layer 154A on the upper surface of the silicon layer 153, and further perform heat treatment or the like. As a result, the metal atoms in the metal layer 154A diffuse in the silicon layer 153 and a silicide is formed.

Now, the conductive layer 108 functions as the source line contact LI, hence its electrical resistance value is desirably low. In order to reduce the electrical resistance value of the conductive layer 108, a width in the Z direction of the second silicide layer 154 is desirably large.

Accordingly, in the method of manufacturing according to the present embodiment, the silicon layer 153 is formed thinly enough for the opening op2 not to be filled in, whereby the crevice CC is formed in the upper surface of the silicon layer 153. Moreover, the width in the Y direction of the crevice CC is broadened and the metal layer 154A is formed inside the crevice CC.

Such a method makes it possible to further increase a contact area between the silicon layer 153 and the metal layer 154A, compared to when, for example, the inside of the opening op2 is filled in by the silicon layer 153. Moreover, since the width in the Y direction of the crevice CC is broadened, the metal layer 154A can be easily implanted inside the crevice CC. As a result, metal atoms in the metal layer 154A can be preferably dispersed in the silicon layer 153 and the second silicide layer 154 having a large width in the Z direction can be formed.

Second Embodiment

Configuration

Figure 24:
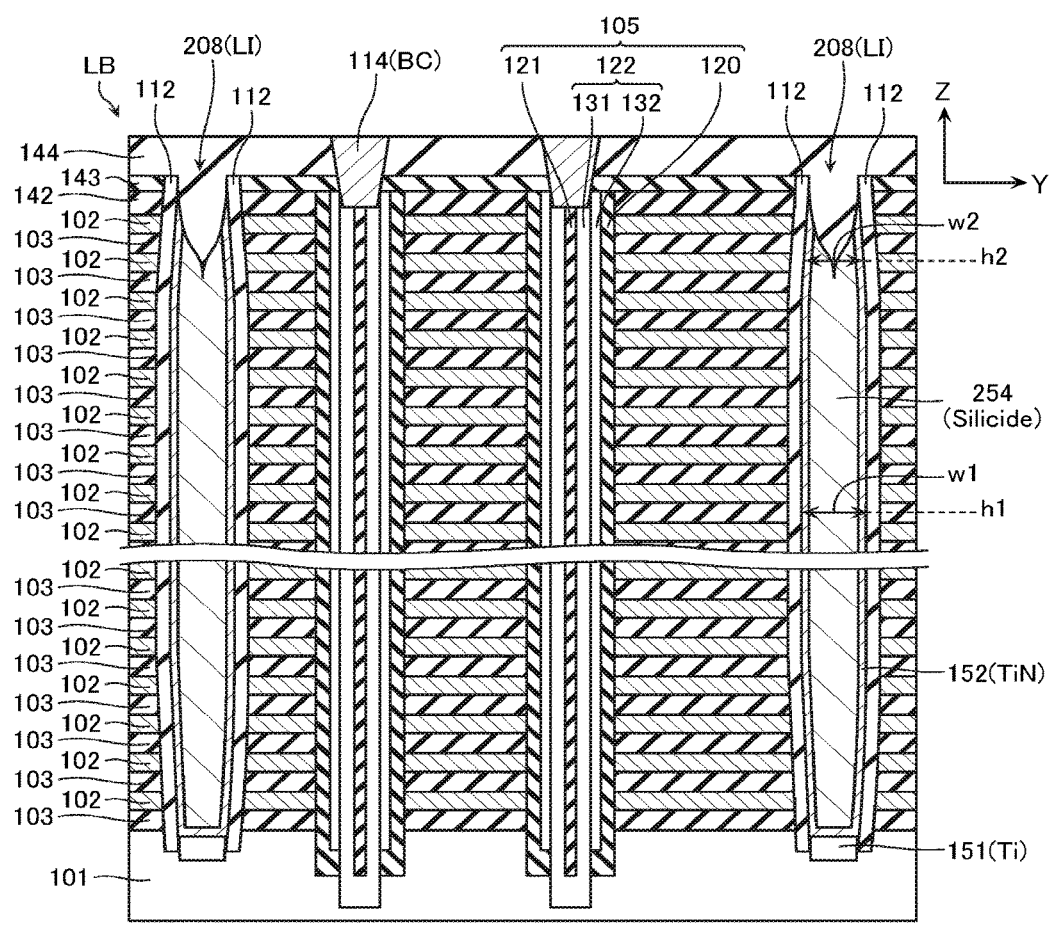
FIG. 24 is a cross-sectional view showing a configuration of part of a semiconductor memory device according to a second embodiment.

FIG. 24 is a cross-sectional view showing a configuration of a semiconductor memory device according to a second embodiment. In the description below, portions similar to those of the first embodiment will be assigned with identical reference symbols to those assigned in the first embodiment, and descriptions thereof will be omitted.

The semiconductor memory device according to the present embodiment is basically configured similarly to that of the first embodiment. However, a configuration of a conductive layer 208 functioning as the source line contact LI is different from that of the conductive layer 108 according to the first embodiment.

The conductive layer 108 is formed in an inverted tapered shape. In contrast, the conductive layer 208 according to the present embodiment is formed such that its side surface in the Y direction bulges in the Y direction. That is, a width w1 in the Y direction of the conductive layer 208 at certain height h1 is larger than a width w2 in the Y direction of the conductive layer 208 at a height h2 above the height h1.

Moreover, the conductive layer 108 comprises: the silicon layer 153; and the second silicide layer 154 provided on the upper surface of this silicon layer 153. In contrast, the conductive layer 208 does not include the silicon layer 153 and the second silicide layer 154, and includes a second silicide layer 254.

The second silicide layer 254 has its lower surface and side surface covered by the barrier metal layer 152. Moreover, a recess is formed in an upper surface of the second silicide layer 254. The second silicide layer 254 is configured from the likes of tantalum silicide ($TaSi_x$), tungsten silicide ($WSi_x$), or platinum silicide ($PtSi_x$), for example.

[Method of Manufacturing]

FIGS. 25 to 31 are cross-sectional views for explaining a method of manufacturing a semiconductor memory device according to the present embodiment, and each show a cross section corresponding to FIG. 24.

The method of manufacturing a semiconductor memory device according to the present embodiment is similar to that of the first embodiment from the step described with reference to FIG. 7 to the step described with reference to FIG. 12.

Figure 25:
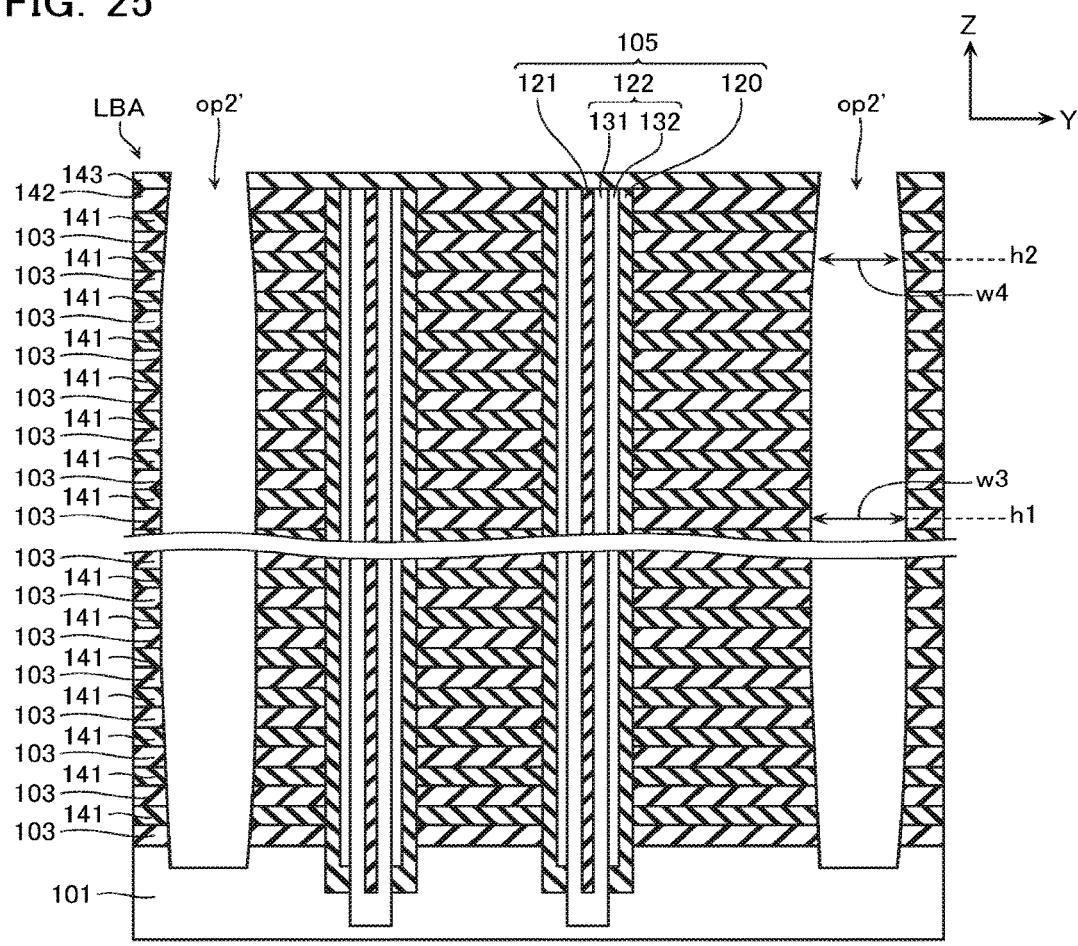
FIGS. 25 to 31 are cross-sectional views for explaining a method of manufacturing the same semiconductor memory device.

As shown in FIG. 25, in the method of manufacturing according to the present embodiment, an opening op2' is formed in the stacked body LBA. The opening op2' is basically formed similarly to the opening op2 (FIG. 13). However, the opening op2' is formed such that a width w3 at the height h1 is broader than a width w4 at the height h2 above the height h1.

Figure 26:
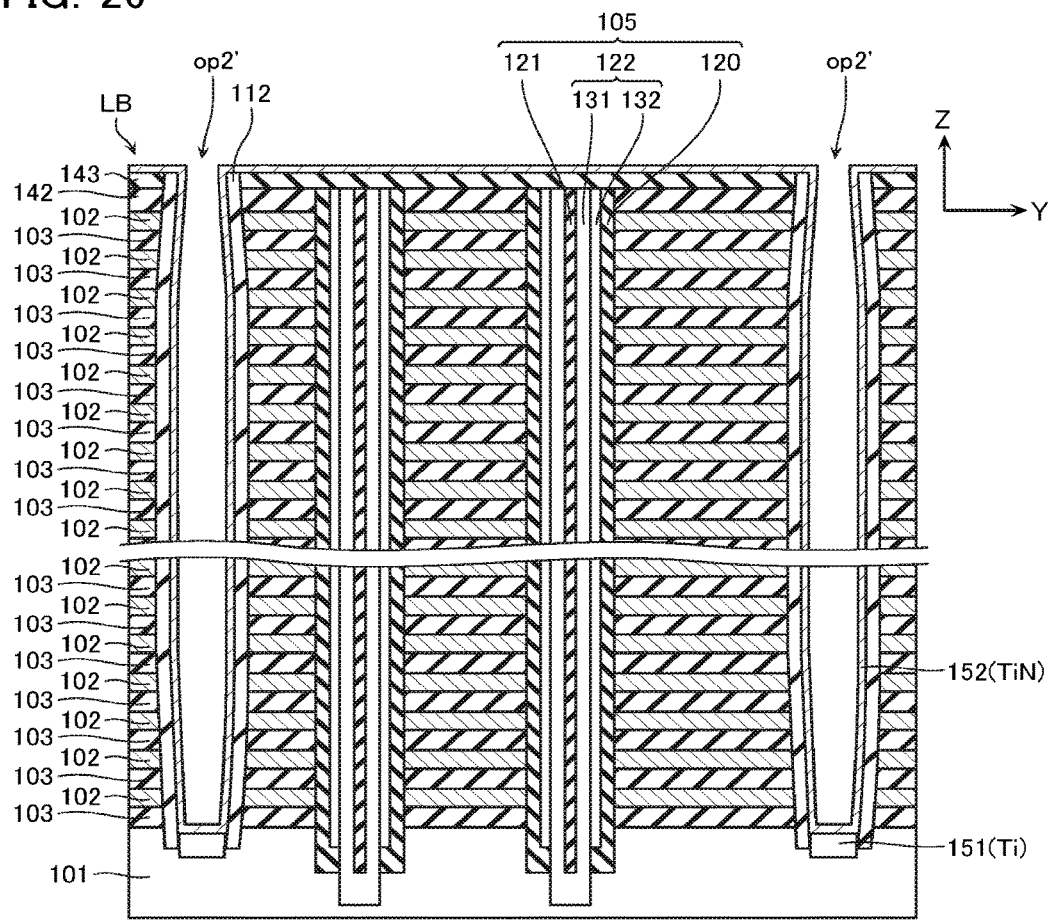

Next, steps similar to the steps described with reference to FIGS. 14 to 18 are performed, and, as shown in FIG. 26, the second inter-layer insulating layer 112 is formed on an inner wall of the opening op2', the first silicide layer 151 is formed on a bottom surface of the opening op2', and the barrier metal layer 152 is formed on the side surface of the second inter-layer insulating layer 112 and on the upper surfaces of the first silicide layer 151 and the inter-layer insulating layer 143.

Figure 27:
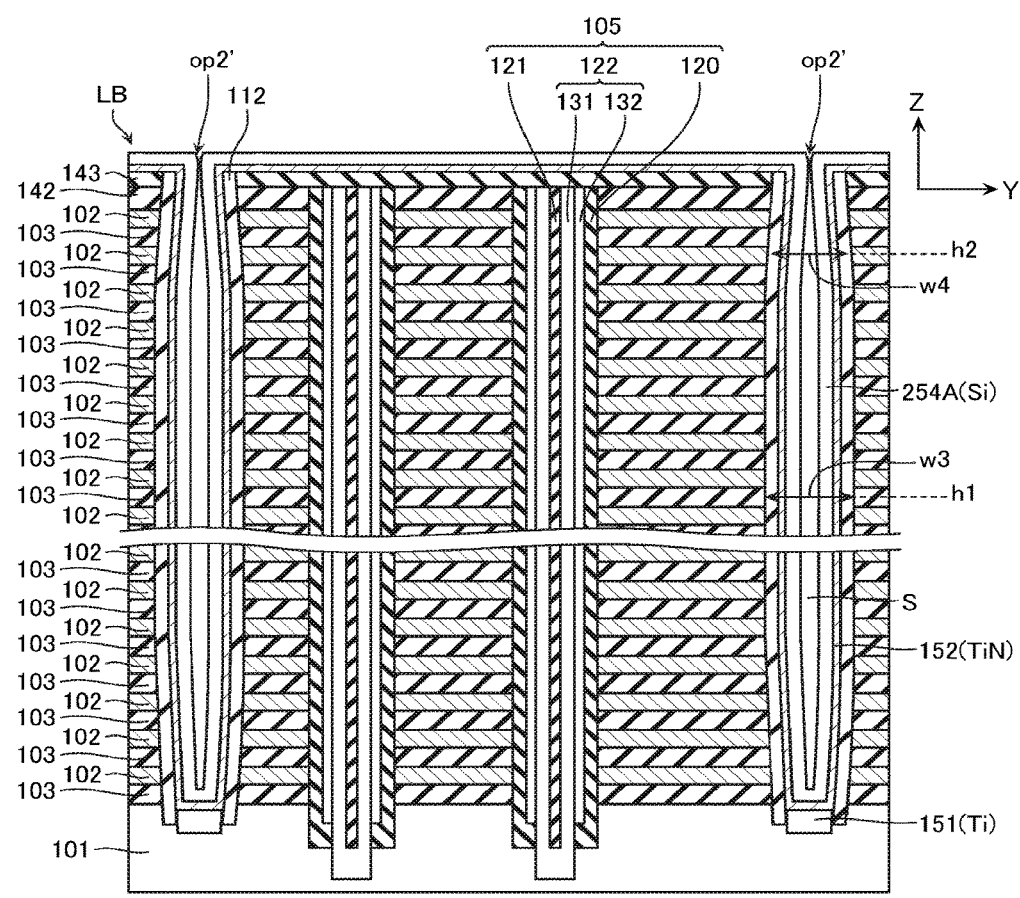

Next, as shown in FIG. 27, a silicon layer 254A is formed. Formation of the silicon layer 254A is performed by depositing amorphous state silicon (Si), by a means such as CVD, on the upper surface and side surface of the barrier metal layer 152. Note that a film thickness of the silicon layer 254A is adjusted to a thickness of a degree that the opening op2' is blocked, for example. As a result, a seam S (cavity) covered by the silicon layer 254A is formed inside the opening op2'.

Figure 28:
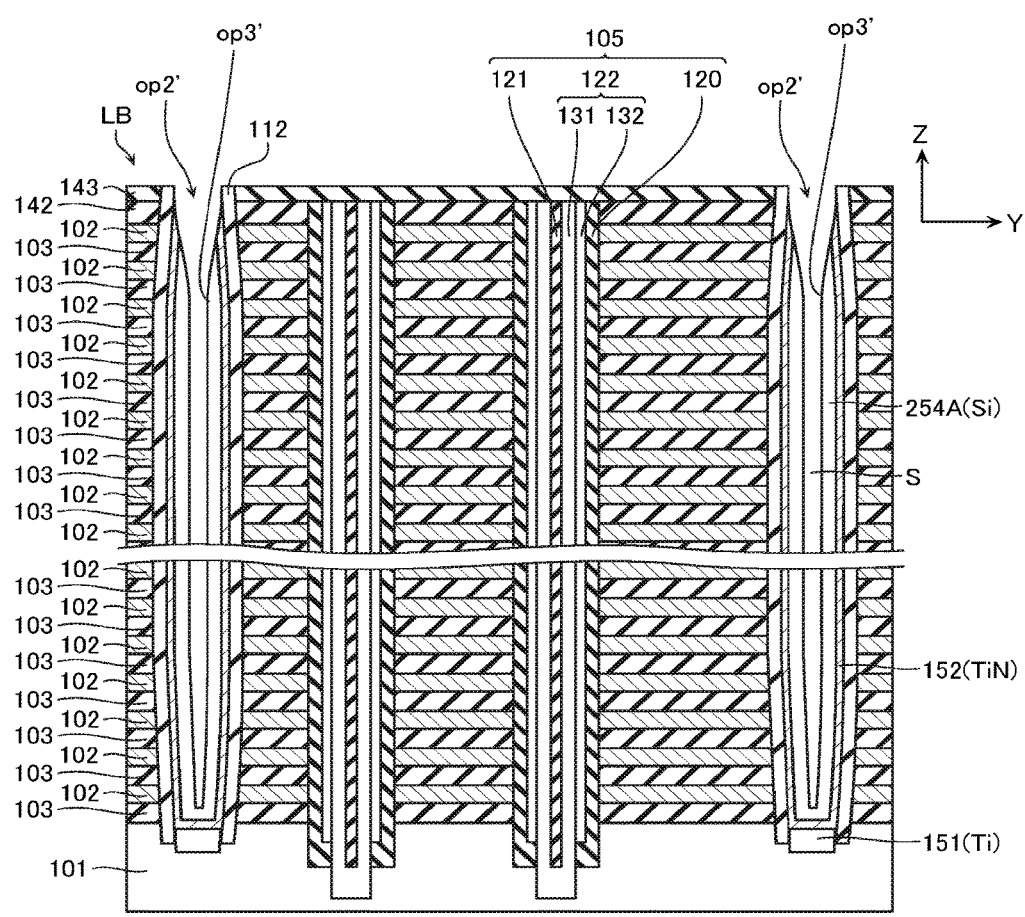

Next, as shown in FIG. 28, portions covering the upper surface of the inter-layer insulating layer 143, of the silicon layer 254A and the barrier metal layer 152, are removed. This step is performed by a means such as etching-back, for example. In this step, part of the silicon layer 254A is removed also inside the opening op2'. As a result, a third opening op3' communicating with the seam S is formed in the silicon layer 254A, and a space within the seam S is opened to the outside.

Figure 29:
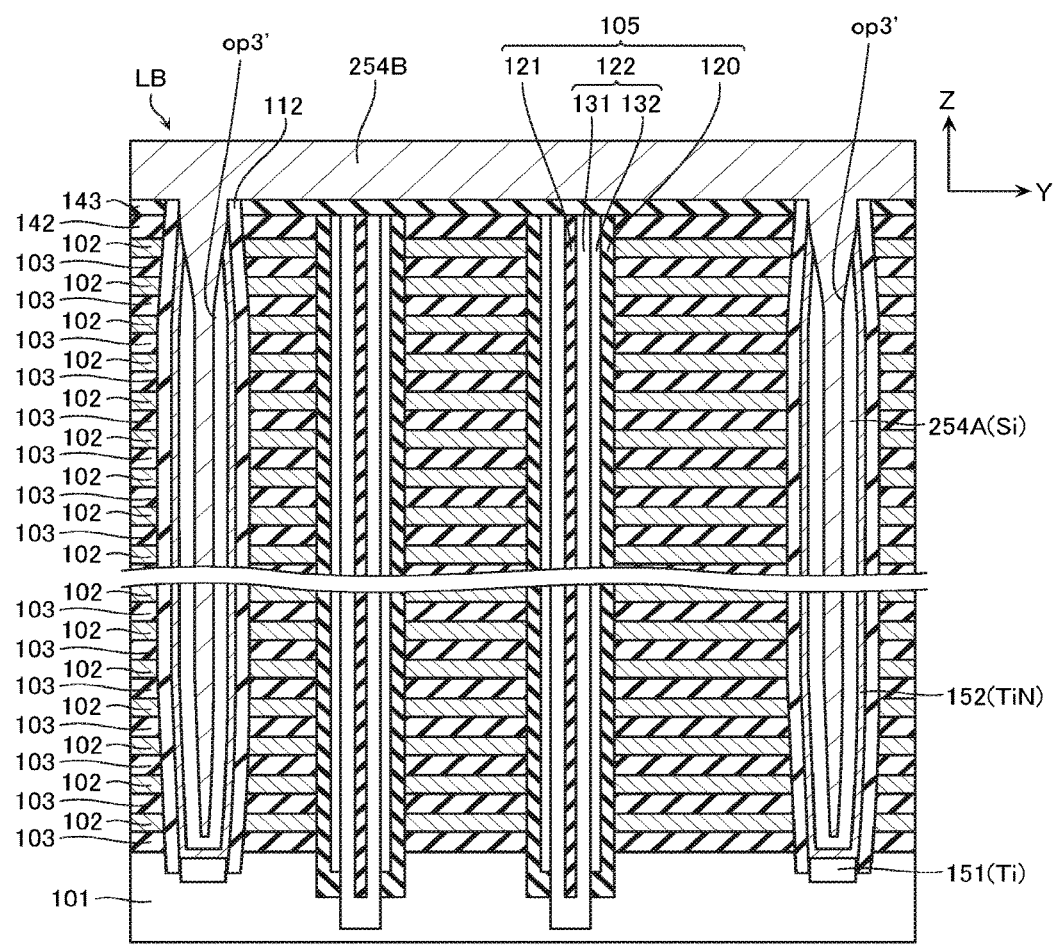

Next, as shown in FIG. 29, a metal layer 254B is formed. Formation of the metal layer 254B is performed by, for example, PVD such as sputtering. Note that the metal layer 254B is formed also inside the opening op3' and the seam S.

Figure 30:
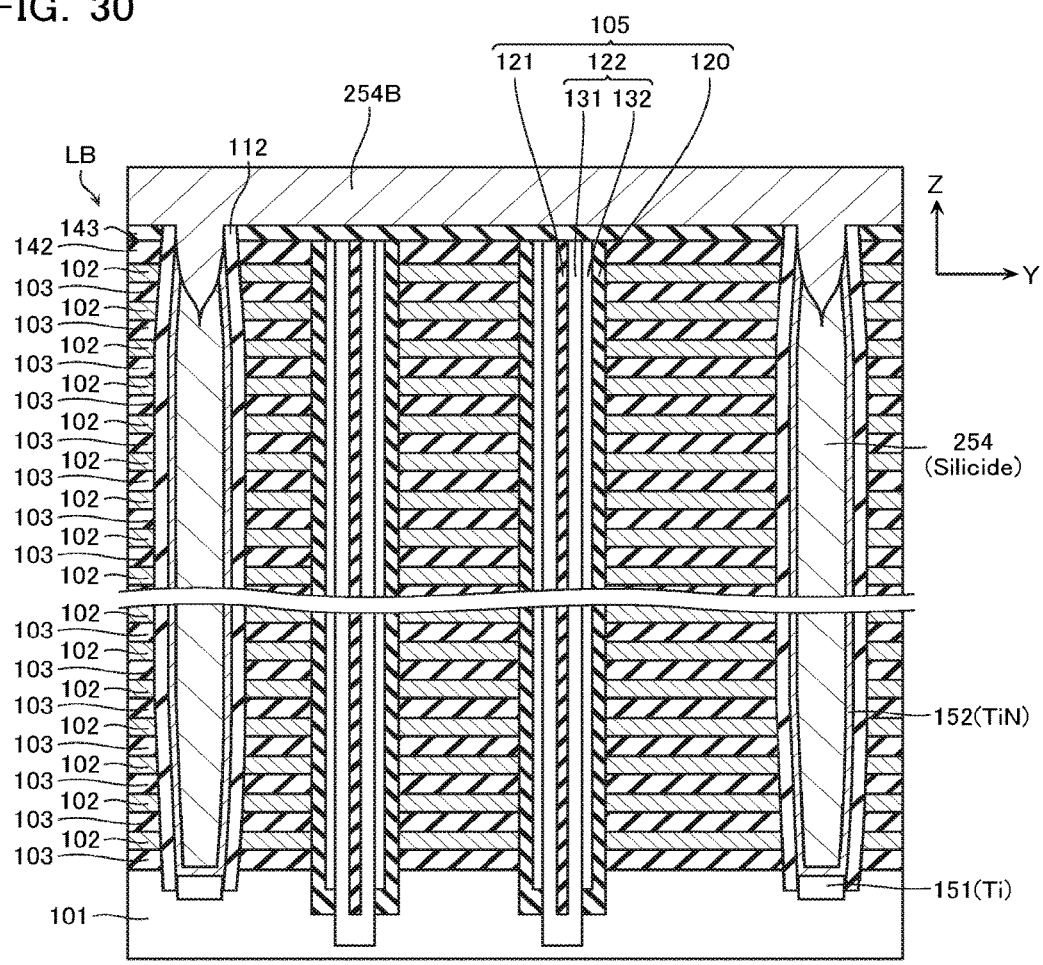

Next, as shown in FIG. 30, the second silicide layer 254 is formed. The second silicide layer 254 is formed by the likes of heat treatment, for example. Note that the lower surface and side surface of the silicon layer 254A are covered by the barrier metal layer 152. Therefore, metal atoms that have diffused in the silicon layer 254A do not reach the first silicide layer 151 or the substrate 101.

Figure 31:
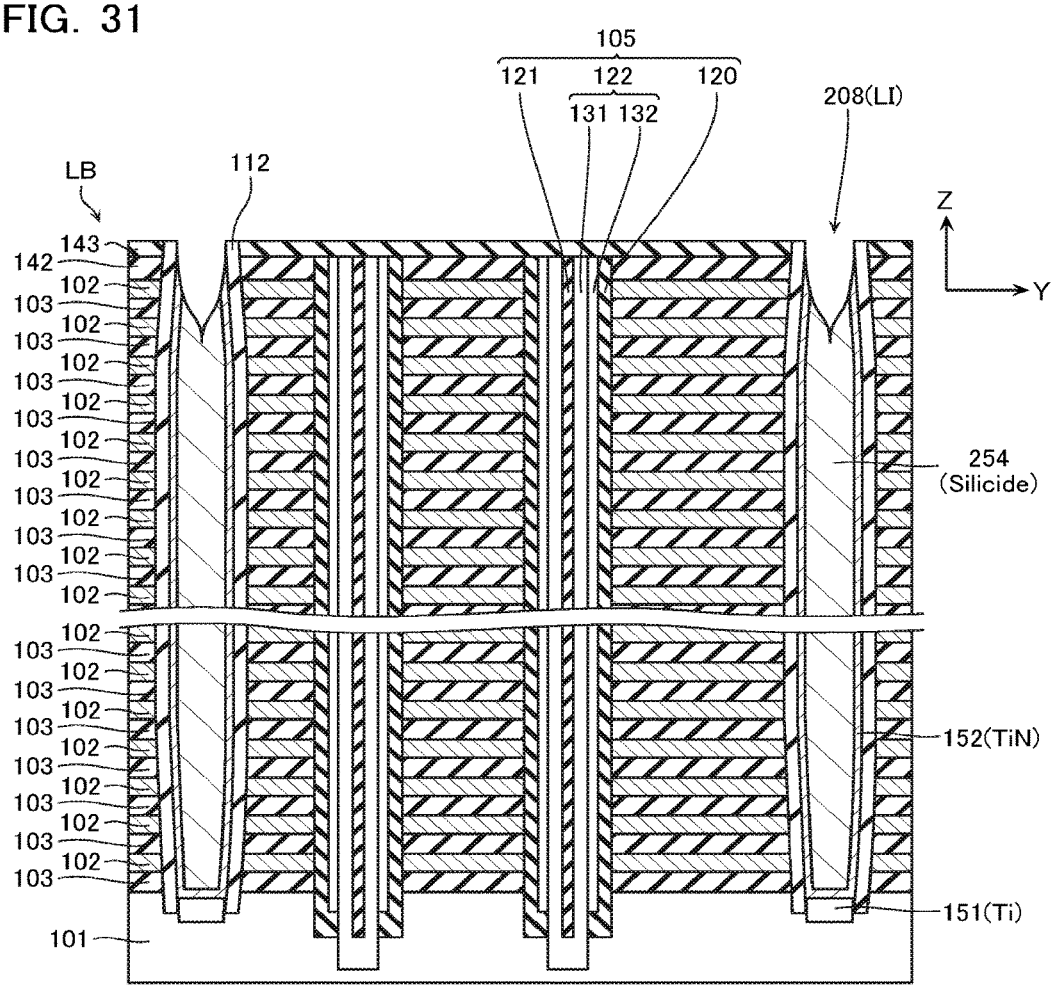

Next, as shown in FIG. 31, the metal layer 254B is removed by a means such as wet etching. As a result, the conductive layer 208 is formed.

Then, as shown in FIG. 24, the inter-layer insulating layer 144 is formed on the upper surfaces of the inter-layer insulating layer 143, the conductive layer 208, and the second inter-layer insulating layer 112, and the conductive layer 114 is formed, whereby a semiconductor memory device due to the method of manufacturing of the second embodiment is completed.

Third Embodiment

Configuration

Figure 32:
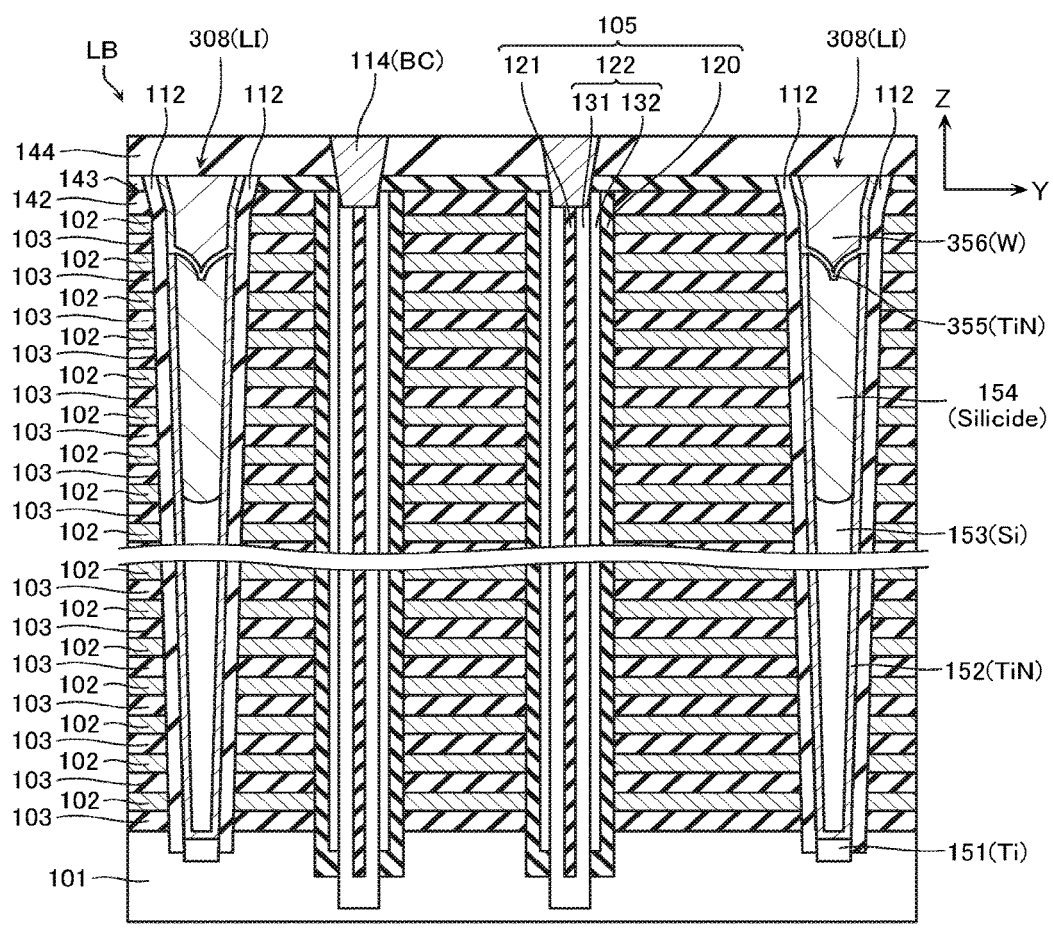
FIG. 32 is a cross-sectional view showing a configuration of part of a semiconductor memory device according to a third embodiment.

FIG. 32 is a cross-sectional view showing a configuration of a semiconductor memory device according to a third embodiment. In the description below, portions similar to those of the first embodiment will be assigned with identical reference symbols to those assigned in the first embodiment, and descriptions thereof will be omitted.

The semiconductor memory device according to the present embodiment is basically configured similarly to that of the first embodiment. However, a configuration of a conductive layer 308 functioning as the source line contact LI is different from that of the conductive layer 108 according to the first embodiment.

The conductive layer 308 according to the present embodiment, in addition to including the first silicide layer 151, the barrier metal layer 152, the silicon layer 153, and the second silicide layer 154, includes also a second barrier metal layer 355 and a second conductive layer 356.

The second barrier metal layer 355 covers the upper surfaces of the barrier metal layer 152 and second silicide layer 154 and the side surface of the second inter-layer insulating layer 112. In the example shown in FIG. 32, the second barrier metal layer 355 is configured from titanium nitride ($TiN_x$).

The second conductive layer 356 has its lower surface and side surface covered by the second barrier metal layer 355. Moreover, a height of an upper surface of the second conductive layer 356 substantially matches heights of upper ends of the inter-layer insulating layer 143, the second inter-layer insulating layer 112, and the second barrier metal layer 355. In the example shown in FIG. 32, the second conductive layer 356 is configured from tungsten (W).

[Method of Manufacturing]

Figure 33:
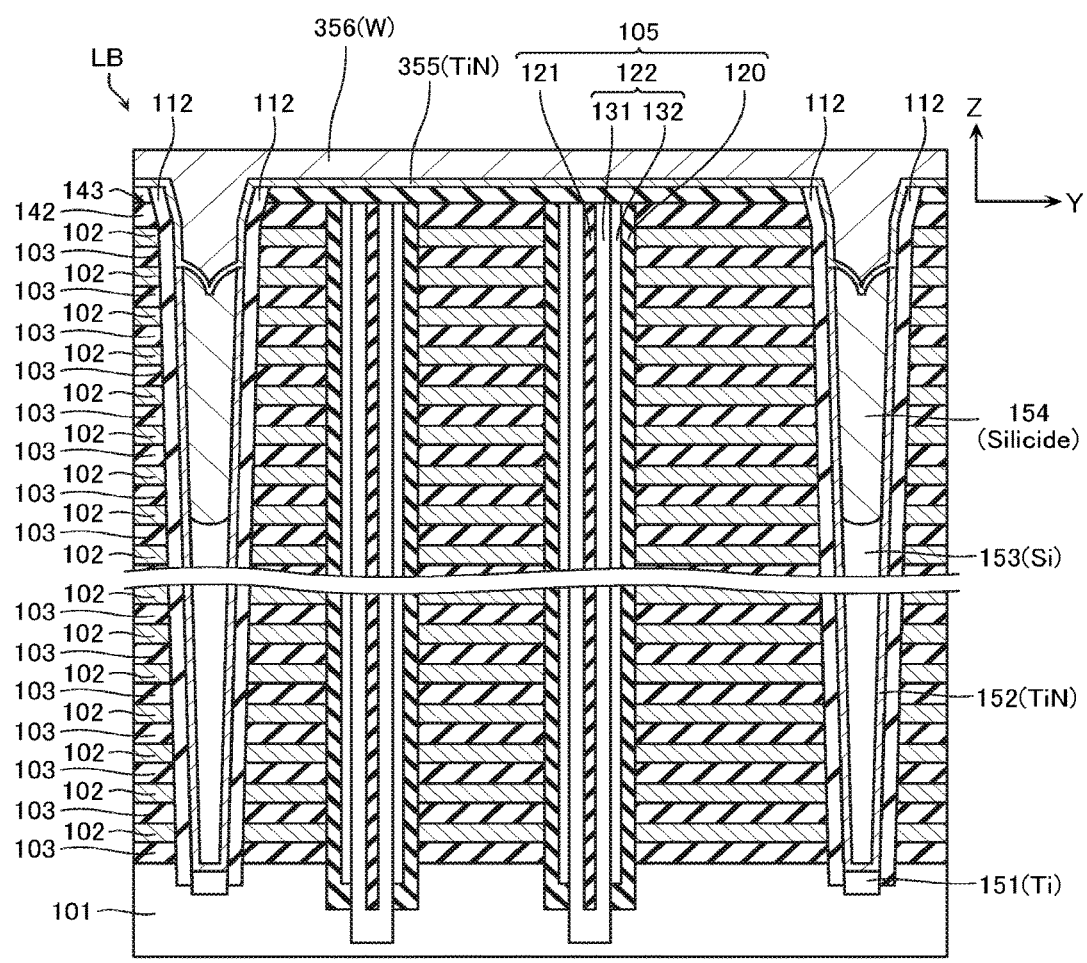
FIGS. 33 and 34 are cross-sectional views for explaining a method of manufacturing the same semiconductor memory device.
Figure 34:
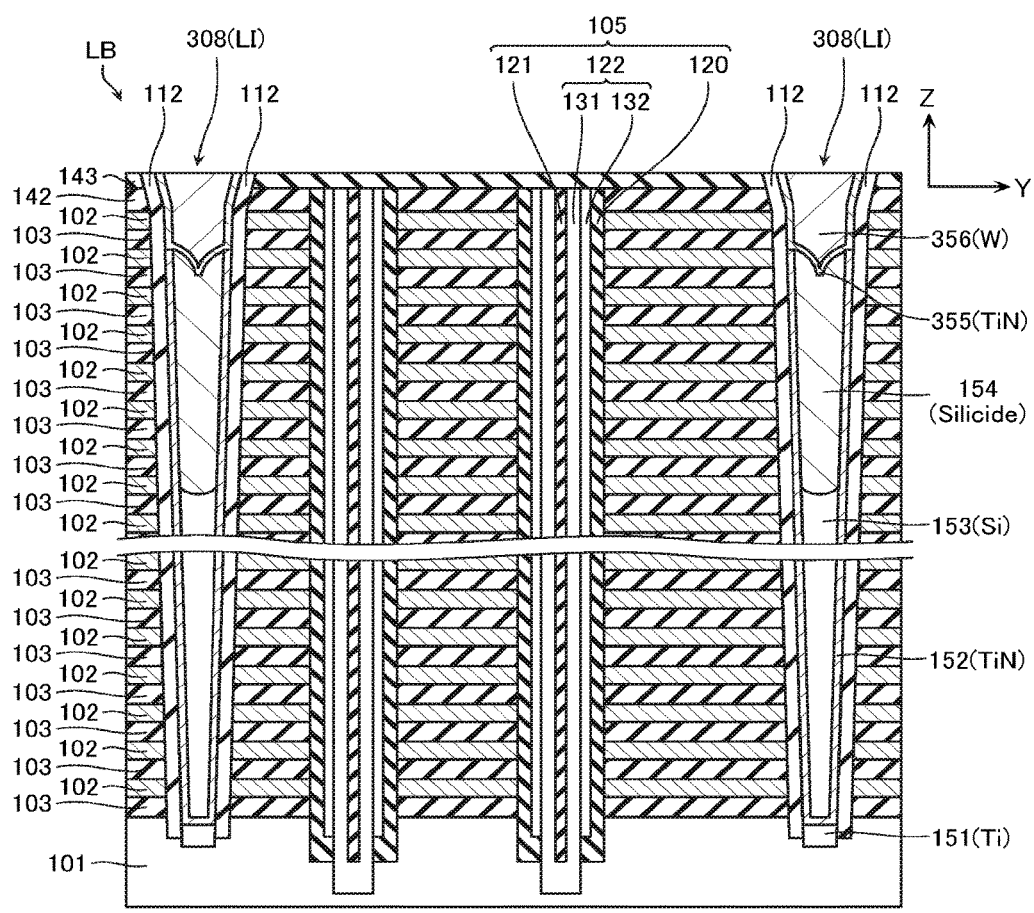

FIGS. 33 and 34 are cross-sectional views for explaining a method of manufacturing a semiconductor memory device according to the present embodiment, and each show a cross section corresponding to FIG. 32.

The method of manufacturing a semiconductor memory device according to the present embodiment is similar to that of the first embodiment from the step described with reference to FIG. 7 to the step described with reference to FIG. 23. Note that FIGS. 33 and 34 show an example where more of the semiconductor layer 153 has been removed than in the example shown in FIG. 20.

Next, as shown in FIG. 33, the second barrier metal layer 355 and the second conductive layer 356 are sequentially formed on the upper surfaces of the second silicide layer 154 and barrier metal layer 152, on the side surface and upper surface of the second inter-layer insulating layer 112, and on the upper surface of the inter-layer insulating layer 143. Formation of the second barrier metal layer 355 and the second conductive layer 356 is performed by, for example, sequentially depositing titanium nitride ($TiN_x$) and tungsten (W) by a means such as CVD.

Next, as shown in FIG. 34, portions covering the upper surface of the inter-layer insulating layer 143, of the second barrier metal layer 355 and the second conductive layer 356, are removed. This step is performed by a means such as CMP, for example. As a result, the conductive layer 308 is formed.

Then, as shown in FIG. 32, the inter-layer insulating layer 144 is formed on the upper surfaces of the inter-layer insulating layer 143, the conductive layer 308, and the second inter-layer insulating layer 112, and the conductive layer 114 is formed, whereby a semiconductor memory device due to the method of manufacturing of the third embodiment is completed.

Fourth Embodiment

Configuration

Figure 35:
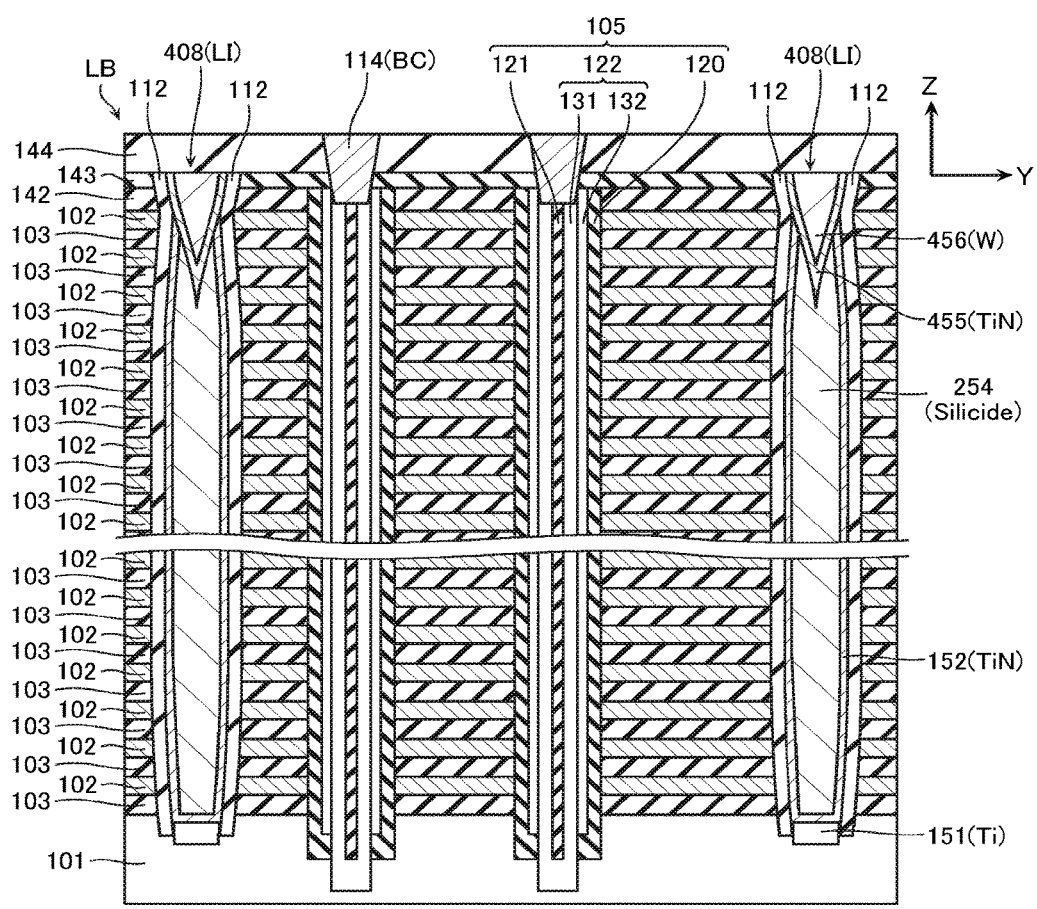
FIG. 35 is a cross-sectional view showing a configuration of part of a semiconductor memory device according to a fourth embodiment.

FIG. 35 is a cross-sectional view showing a configuration of a semiconductor memory device according to a fourth embodiment. In the description below, portions similar to those of the second embodiment will be assigned with identical reference symbols to those assigned in the second embodiment, and descriptions thereof will be omitted.

The semiconductor memory device according to the present embodiment is basically configured similarly to that of the second embodiment. However, a configuration of a conductive layer 408 functioning as the source line contact LI is different from that of the conductive layer 208 according to the second embodiment.

The conductive layer 408 according to the present embodiment, in addition to including the first silicide layer 151, the barrier metal layer 152, and the second silicide layer 254, includes also a second barrier metal layer 455 and a second conductive layer 456. The second barrier metal layer 455 and the second conductive layer 456 are configured similarly to the second barrier metal layer 355 and the second conductive layer 356 according to the third embodiment.

[Method of Manufacturing]

Figure 36:
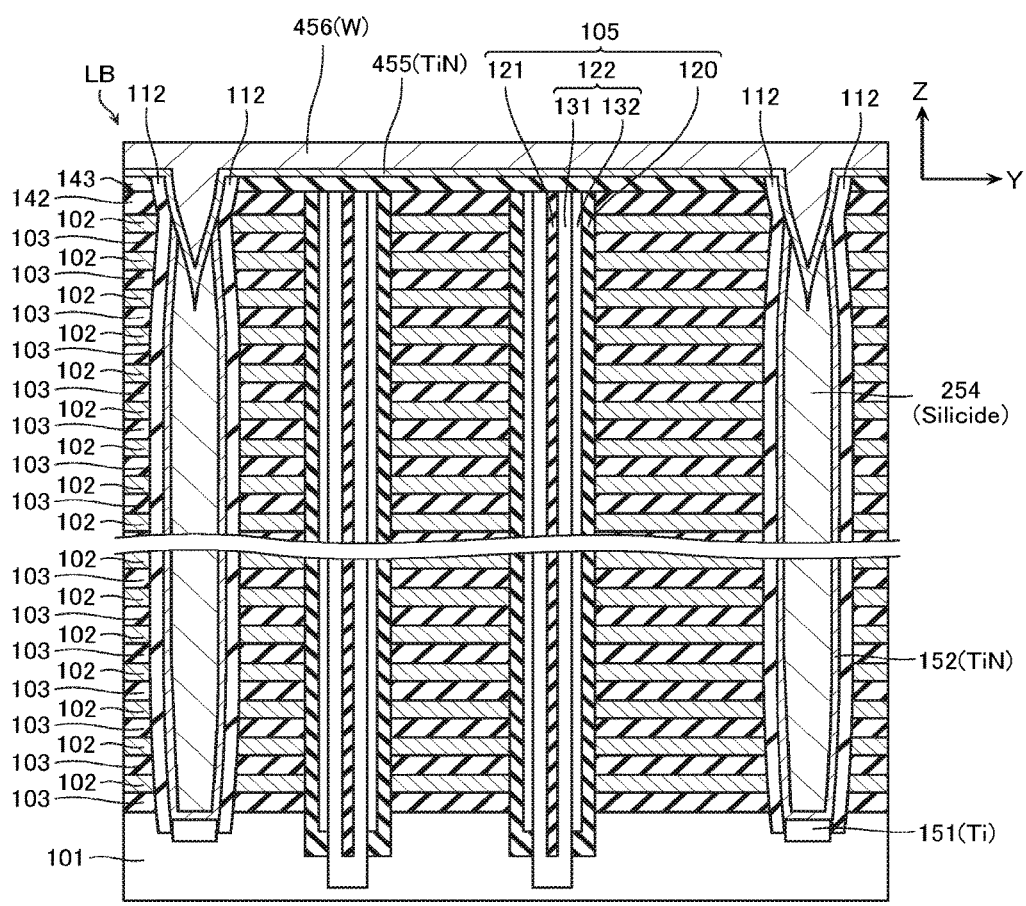
FIGS. 36 and 37 are cross-sectional views for explaining a method of manufacturing the same semiconductor memory device.
Figure 37:
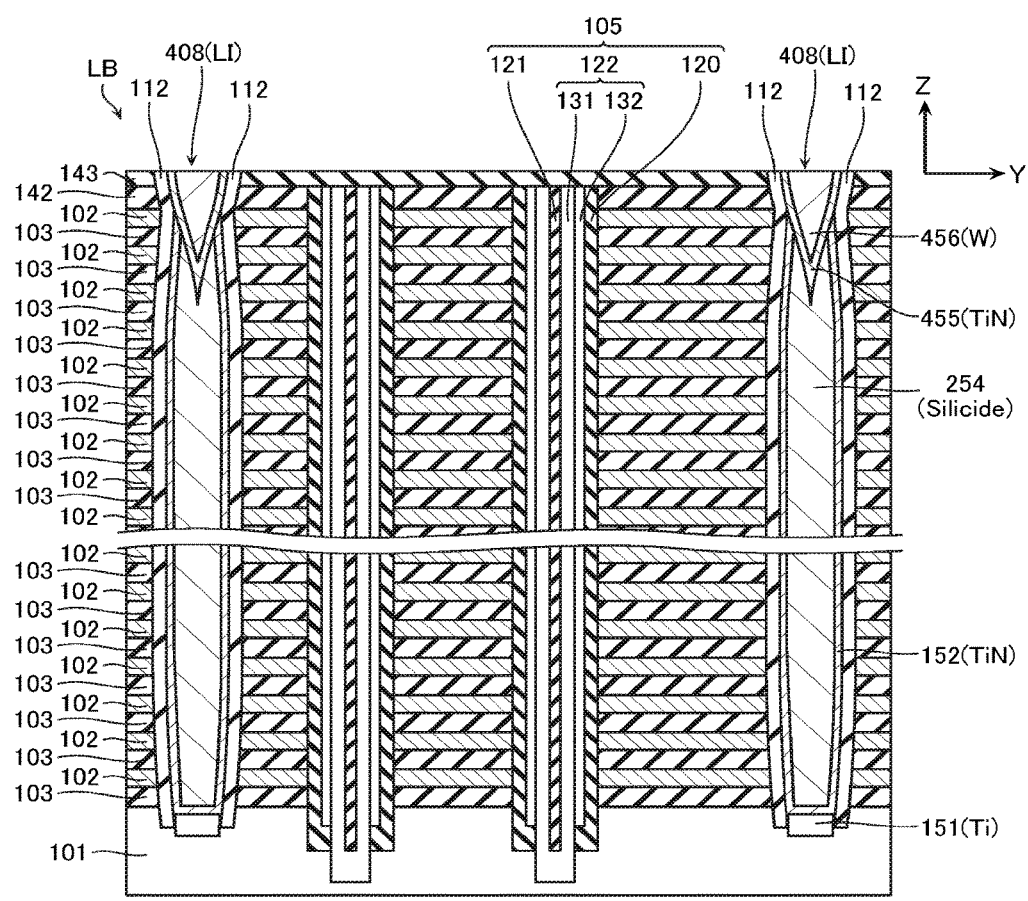

FIGS. 36 and 37 are cross-sectional views for explaining a method of manufacturing a semiconductor memory device according to the present embodiment, and each show a cross section corresponding to FIG. 35.

The method of manufacturing a semiconductor memory device according to the present embodiment is similar to that of the second embodiment up to the step described with reference to FIG. 31. However, FIGS. 36 and 37 show an example where more of the semiconductor layer 254A has been removed than in the example shown in FIG. 28.

Next, as shown in FIG. 36, the second barrier metal layer 455 and the second conductive layer 456 are sequentially formed on the upper surfaces of the second silicide layer 254 and barrier metal layer 152, on the side surface and upper surface of the second inter-layer insulating layer 112, and on the upper surface of the inter-layer insulating layer 143. Formation of the second barrier metal layer 455 and the second conductive layer 456 is performed by, for example, sequentially depositing titanium nitride ($TiN_x$) and tungsten (W) by a means such as CVD.

Next, as shown in FIG. 37, portions covering the upper surface of the inter-layer insulating layer 143, of the second barrier metal layer 455 and the second conductive layer 456, are removed. This step is performed by a means such as CMP, for example. As a result, the conductive layer 408 is formed.

Then, as shown in FIG. 35, the inter-layer insulating layer 144 is formed on the upper surfaces of the inter-layer insulating layer 143, the conductive layer 408, and the second inter-layer insulating layer 112, and the conductive layer 114 is formed, whereby a semiconductor memory device due to the method of manufacturing of the fourth embodiment is completed.

Fifth Embodiment

Configuration

Figure 38:
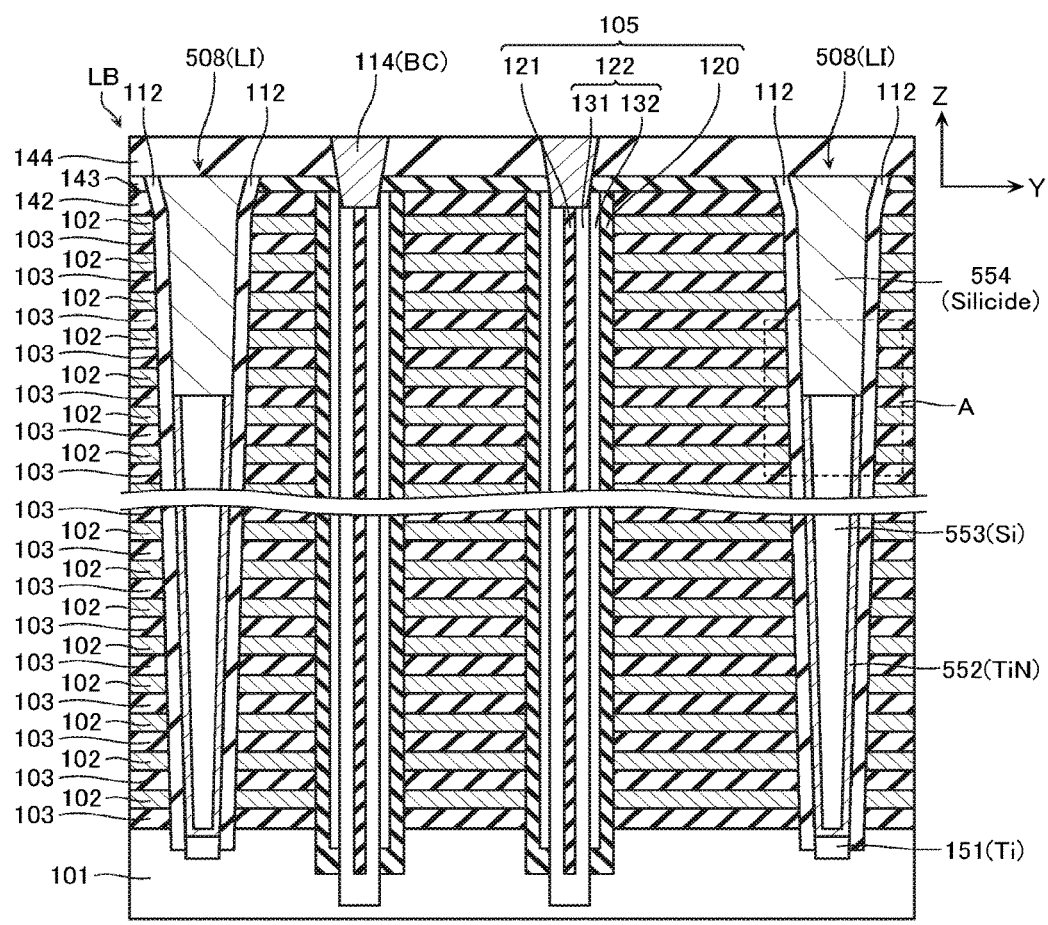
FIGS. 38 and 39 are cross-sectional views each showing a configuration of part of a semiconductor memory device according to a fifth embodiment.
Figure 39:
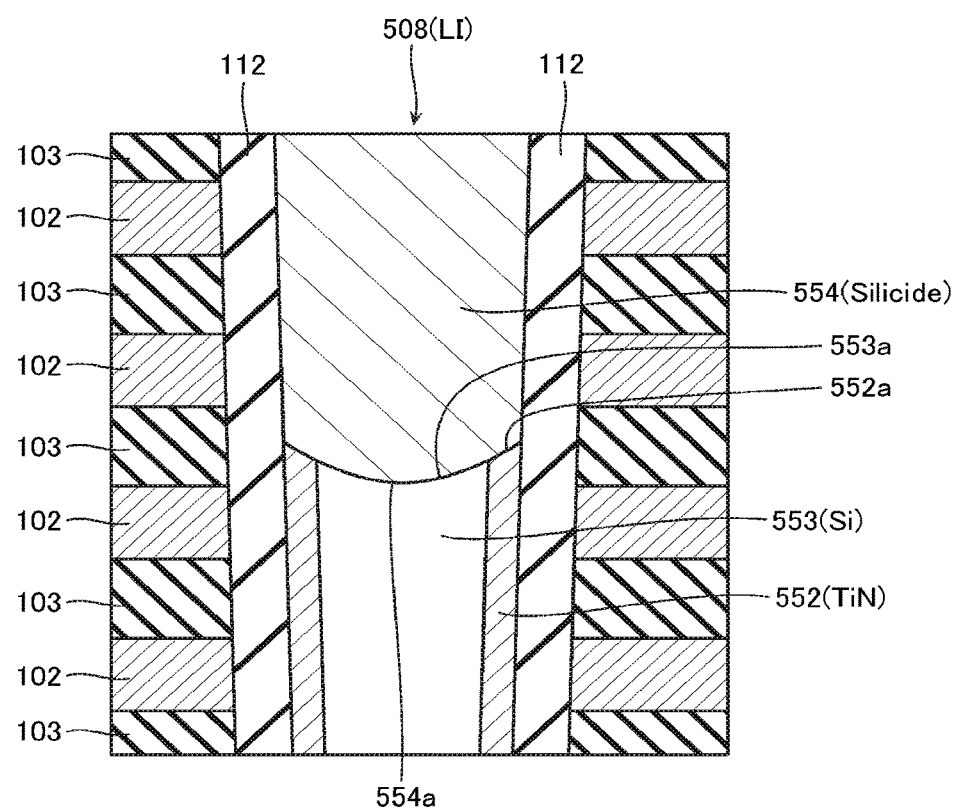

FIG. 38 is a cross-sectional view showing a configuration of a semiconductor memory device according to a fifth embodiment. FIG. 39 is an enlarged view of the portion indicated by A of FIG. 38. In the description below, portions similar to those of the first embodiment will be assigned with identical reference symbols to those assigned in the first embodiment, and descriptions thereof will be omitted.

As shown in FIG. 38, the semiconductor memory device according to the present embodiment is basically configured similarly to that of the first embodiment. However, a configuration of a conductive layer 508 functioning as the source line contact LI is different from that of the conductive layer 108 according to the first embodiment.

The conductive layer 508 according to the present embodiment comprises: the first silicide layer 151 provided on the upper surface of the substrate 101; a barrier metal layer 552 provided on the upper surface of this first silicide layer 151; a silicon layer 553 provided on an upper surface of this barrier metal layer 552; and a second silicide layer 554 provided on an upper surface of this silicon layer 553.

The barrier metal layer 552 and the silicon layer 553 are basically formed similarly to the barrier metal layer 152 and the silicon layer 153 according to the first embodiment. However, as shown in FIG. 39, an upper surface 552a of the barrier metal layer 552 and an upper surface 553a of the silicon layer 553 are formed continuously.

Moreover, the second silicide layer 554 is basically formed similarly to the second silicide layer 154 according to the first embodiment. However, a lower surface 554a of the second silicide layer 554 is connected to the upper surface 552a of the barrier metal layer 552 and the upper surface 553a of the silicon layer 553.

[Method of Manufacturing]

FIGS. 40 to 43 are cross-sectional views for explaining a method of manufacturing a semiconductor memory device according to the present embodiment, and each show a cross section corresponding to FIG. 38.

The method of manufacturing a semiconductor memory device according to the present embodiment is similar to that of the first embodiment from the step described with reference to FIG. 7 to the step described with reference to FIG. 18.

Figure 40:
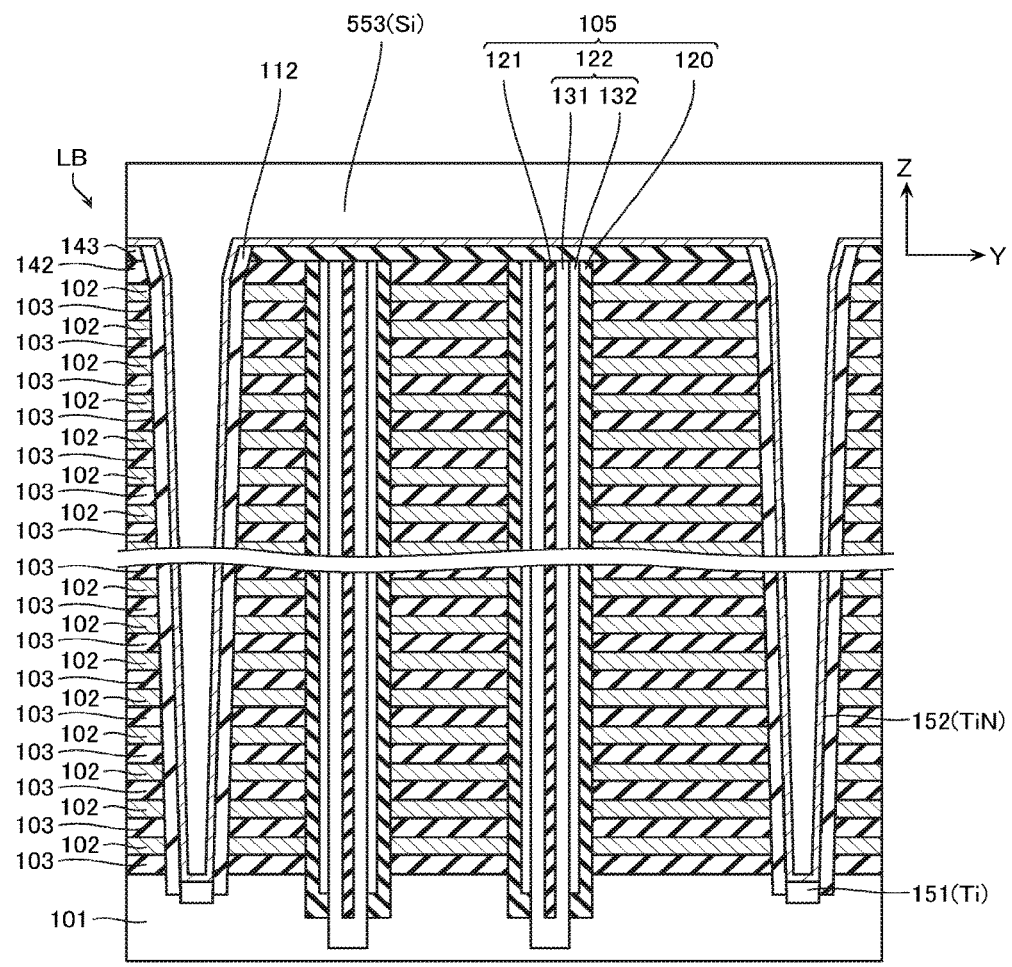
FIGS. 40 to 43 are cross-sectional views for explaining a method of manufacturing the same semiconductor memory device.

Next, as shown in FIG. 40, the silicon layer 553 is formed. Formation of the silicon layer 553 is performed by, for example, depositing amorphous state silicon (Si), by a means such as CVD, on the upper surface and side surface of the barrier metal layer 152. The silicon layer 553 is formed thickly enough for the opening op2 to be filled in, for example.

Figure 41:
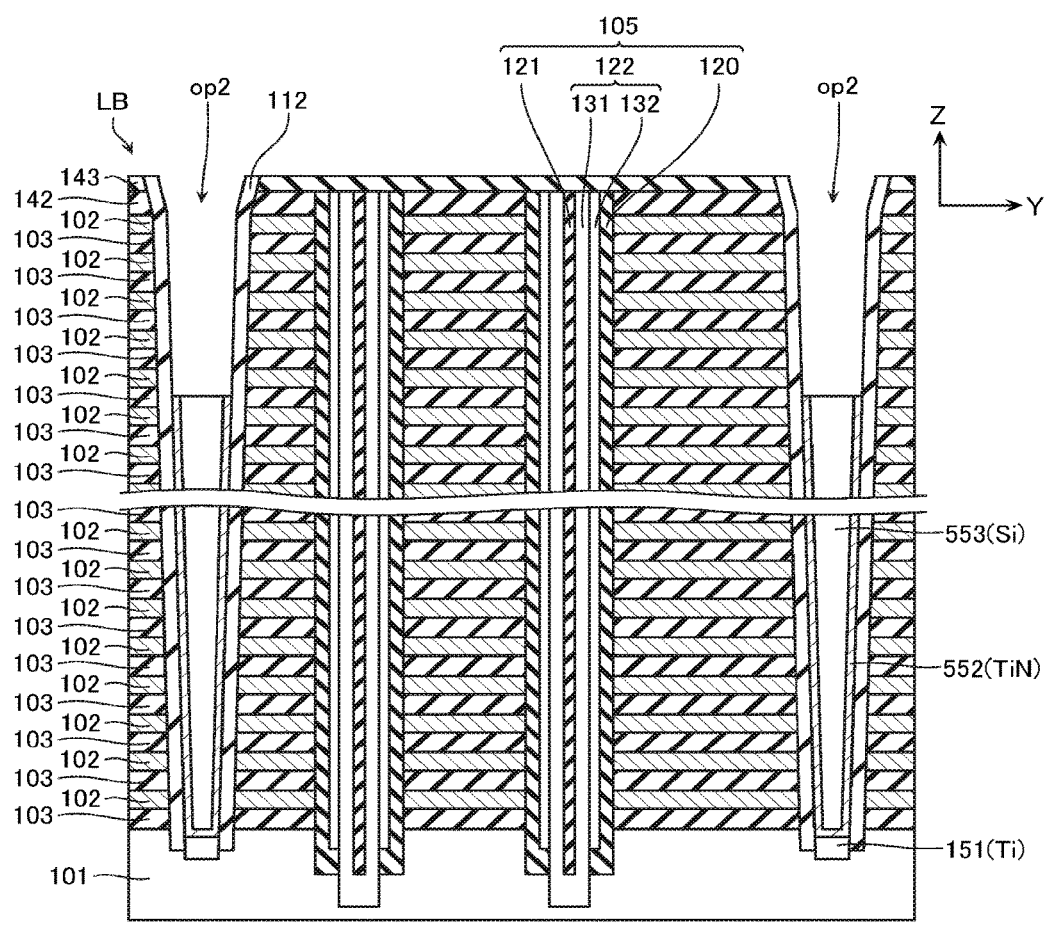

Next, as shown in FIG. 41, portions covering the upper surface of the inter-layer insulating layer 143 and parts of portions positioned inside the opening op2, of the silicon layer 553 and the barrier metal layer 152, are removed. This step is performed by a means such as etching-back, for example. As a result, the silicon layer 553 and the barrier metal layer 552 are formed.

Figure 42:
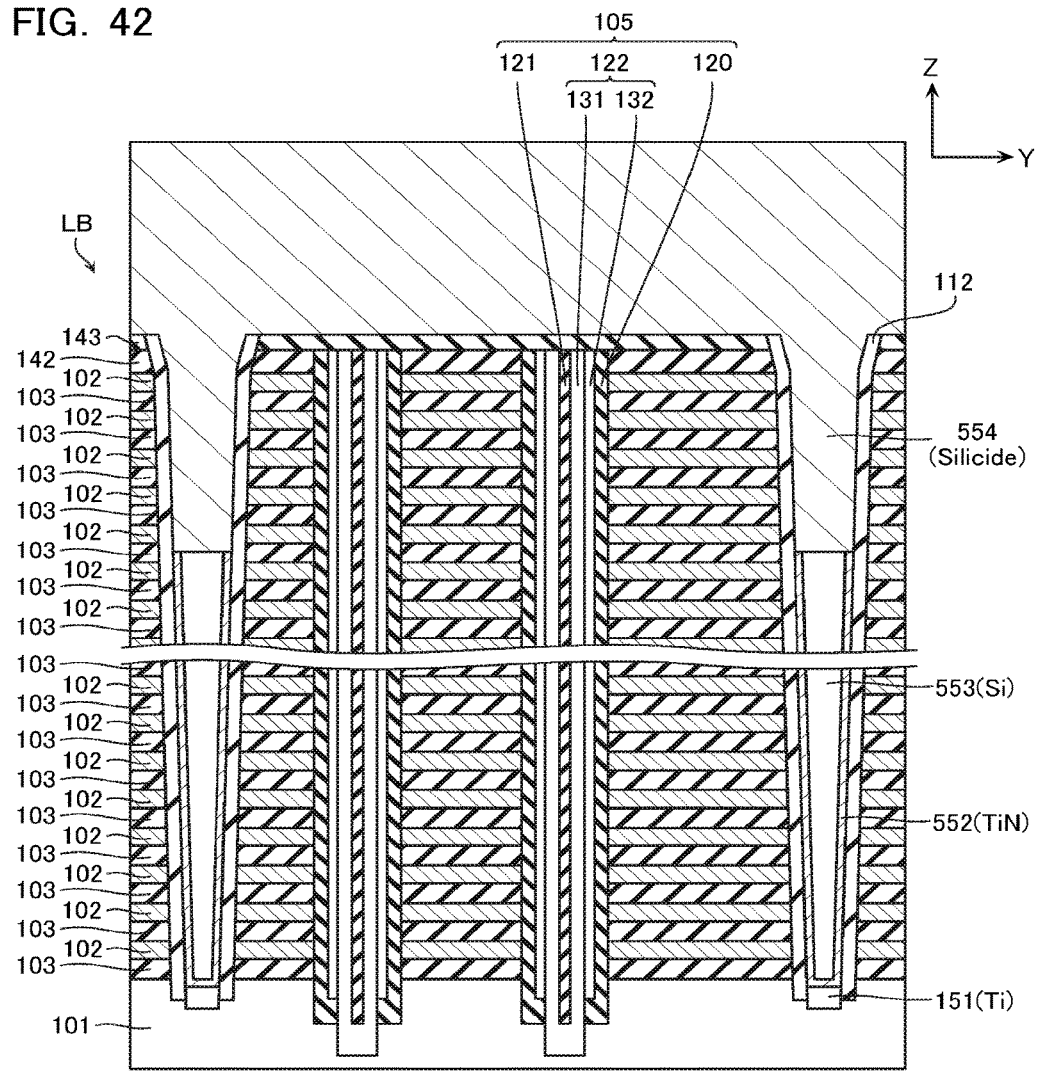

Next, as shown in FIG. 42, the second silicide layer 554 is formed. Formation of the second silicide layer 554 is performed by, for example, PVD such as sputtering.

Figure 43:
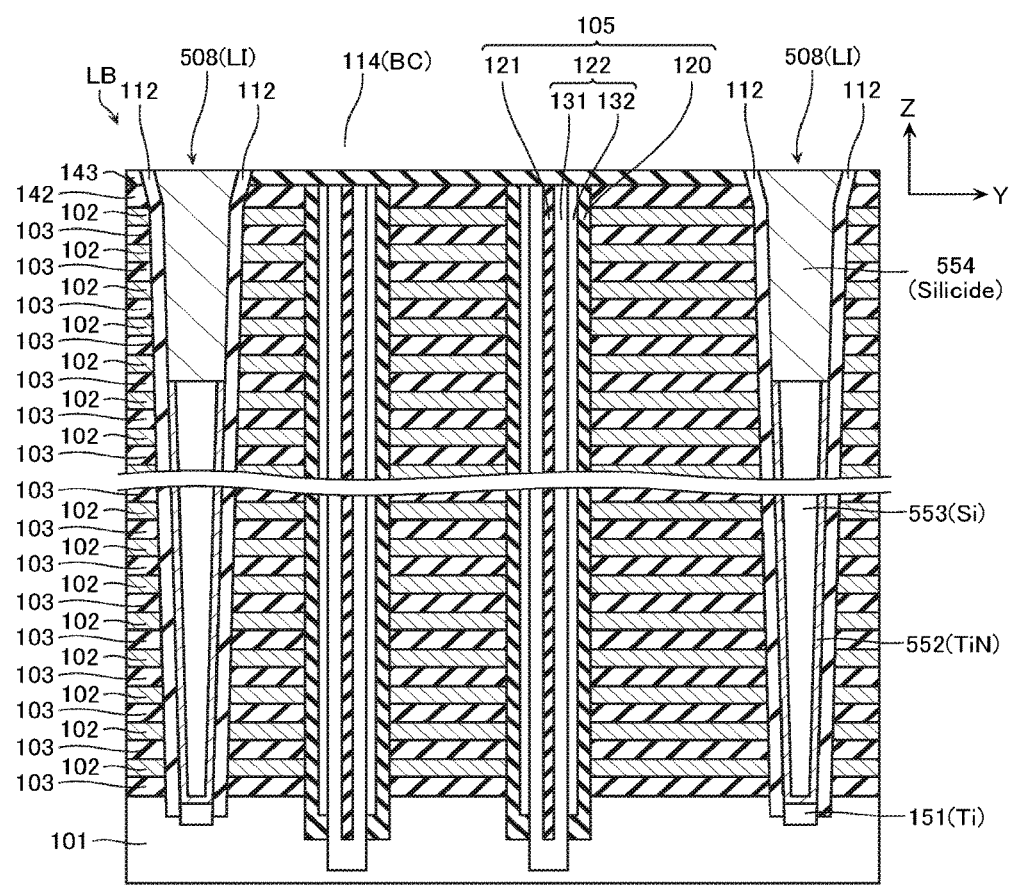

Next, as shown in FIG. 43, a portion covering the upper surface of the inter-layer insulating layer 143, of the second silicide layer 554, is removed. This step is performed by a means such as CMP, for example. As a result, the conductive layer 508 is formed.

Then, as shown in FIG. 38, the inter-layer insulating layer 144 is formed on the upper surfaces of the inter-layer insulating layer 143, the conductive layer 508, and the second inter-layer insulating layer 112, and the conductive layer 114 is formed, whereby a semiconductor memory device due to the method of manufacturing of the fifth embodiment is completed.

Other Embodiments

As described with reference to FIG. 3, the lower end of the semiconductor layer 122 according to the first embodiment is connected to the conductive layer 108 via the substrate 101. However, the lower end of the semiconductor layer 122 may be connected to the conductive layer 108 via a semiconductor layer or conductive layer other than the substrate 101.

Figure 47:
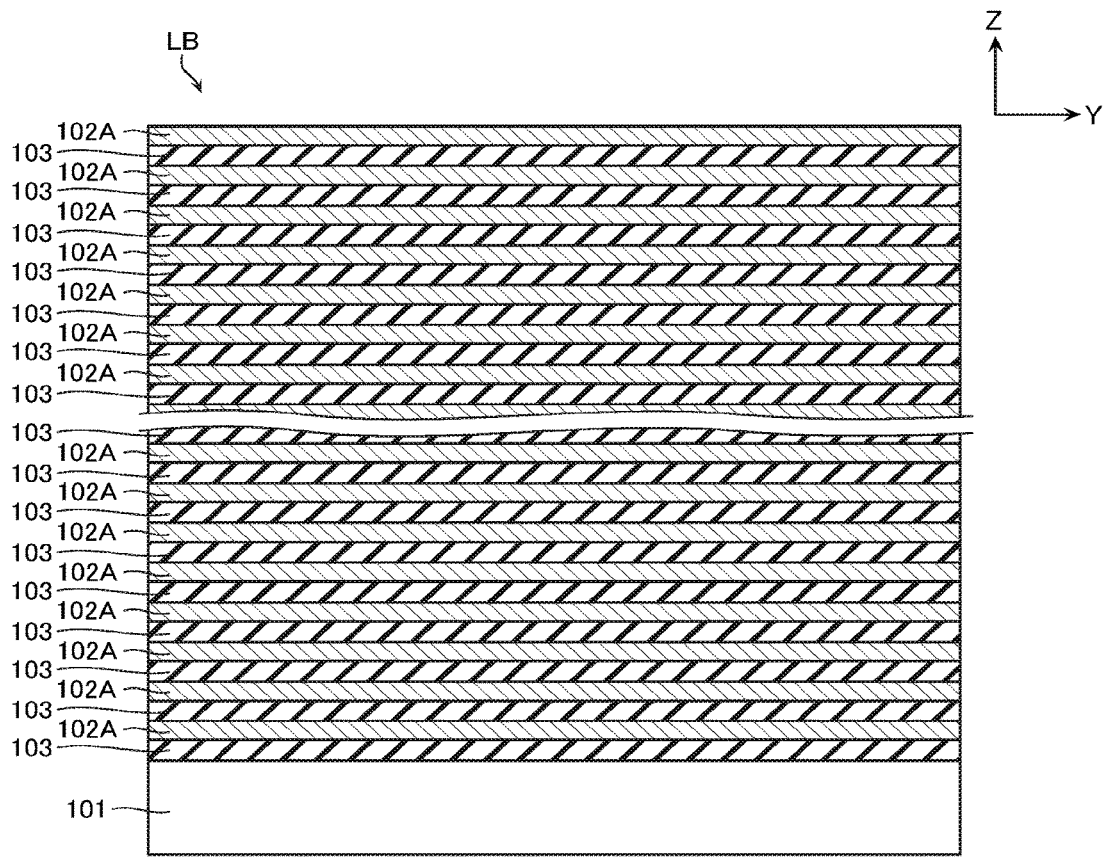
FIG. 47 is a cross-sectional view for explaining a method of manufacturing a semiconductor memory device according to an embodiment.

Moreover, as described with reference to FIG. 7, in the method of manufacturing according to the first embodiment, the stacked body LBA including the plurality of first inter-layer insulating layers 103 and sacrifice layers 141 (first layers) is formed on the substrate 101. However, as shown in FIG. 47, a conductive layer 102A of the likes of polysilicon or tungsten may be formed as the first layer, instead of the sacrifice layer 141. In this case, as shown in FIG. 15, the first conductive layers 102 can be formed by forming the opening op2 to divide the first layers (the conductive layers 102A).

Figure 44:
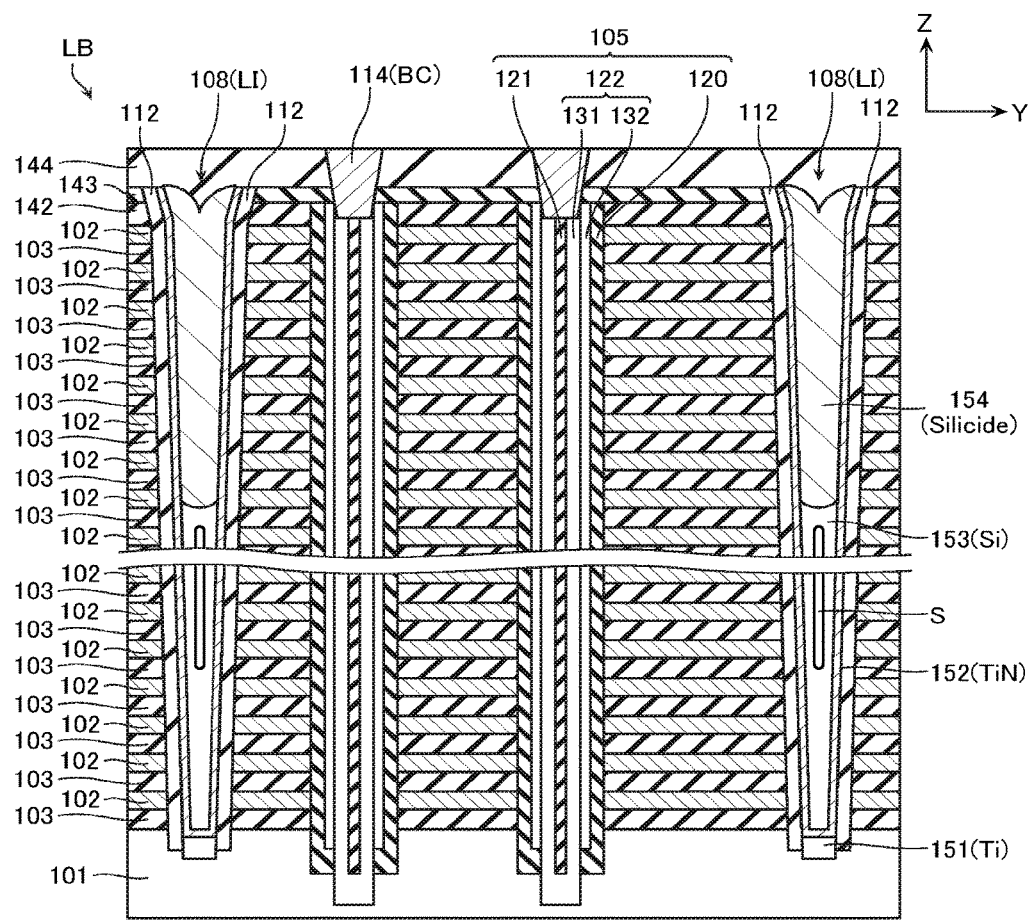
FIGS. 44 to 46 are cross-sectional views each showing a configuration of part of a semiconductor memory device according to another embodiment.
Figure 45:
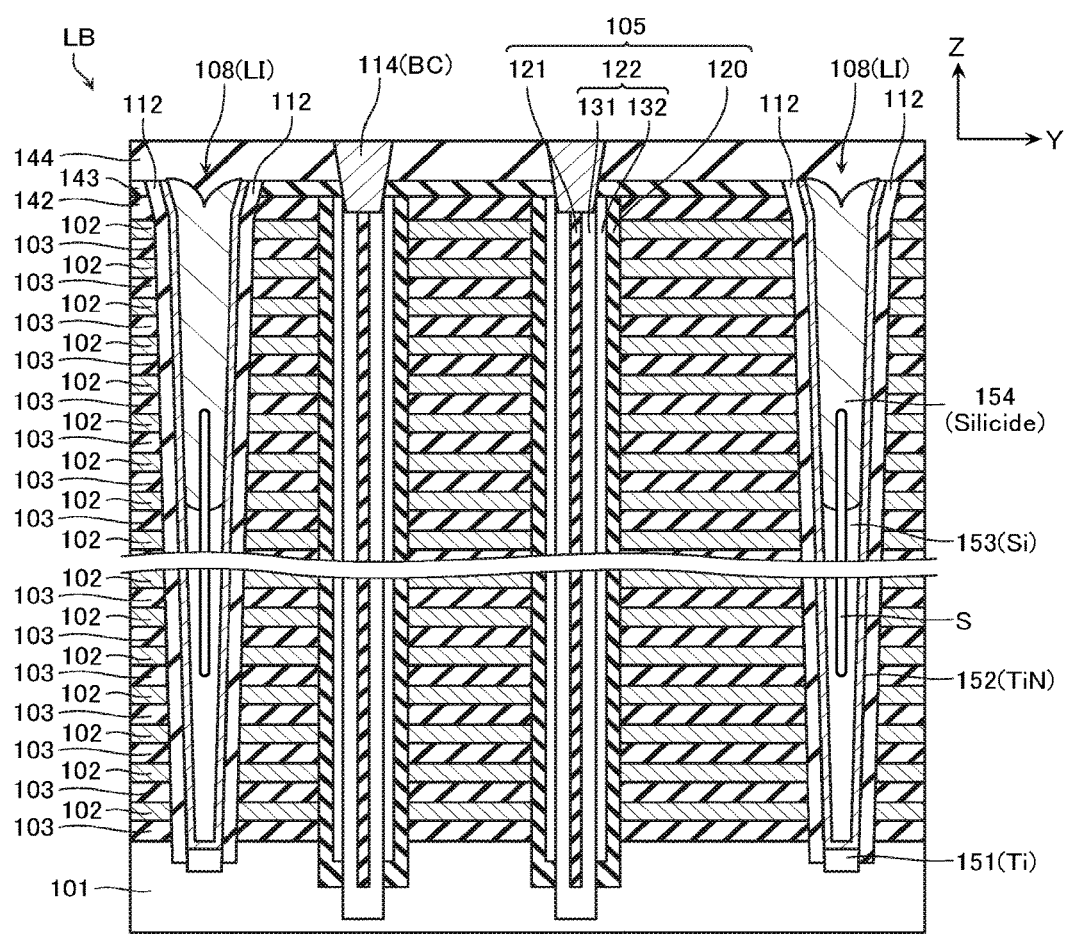
Figure 46:
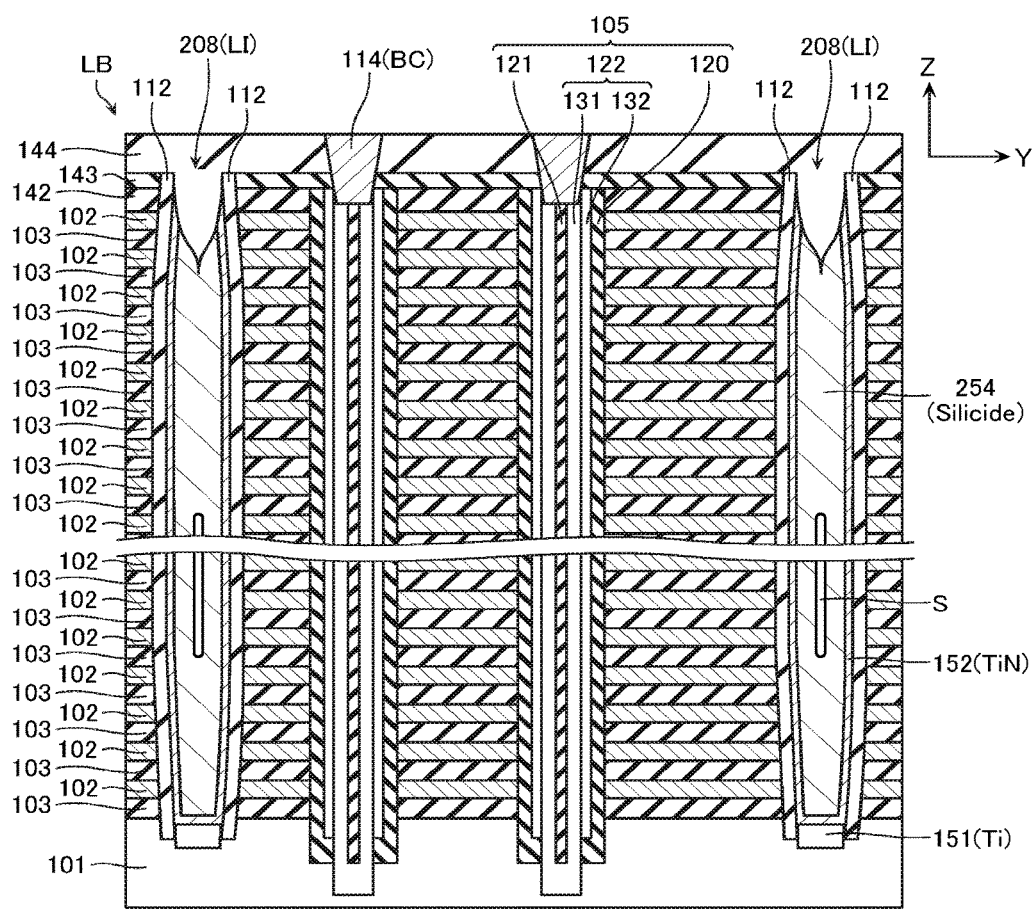

Moreover, as shown in FIG. 44 or 45, the silicon layer 153 and second silicide layer 154 of the conductive layer 108 may include the seam S (cavity). Similarly, as shown in FIG. 46, the second silicide layer 254 also may include the seam S.

Others

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A method of manufacturing a semiconductor memory device, comprising:
   alternately stacking a plurality of first inter-layer insulating layers and first layers above a substrate;
   forming a first opening that penetrates a plurality of the first inter-layer insulating layers and first layers;
   forming a gate insulating layer and a semiconductor layer on an inner wall of the first opening;
   forming a second opening that penetrates a plurality of the first inter-layer insulating layers and first layers;
   forming a second inter-layer insulating layer on a bottom surface and an inner wall of the second opening;
   removing a portion covering the bottom surface of the second opening, of the second inter-layer insulating layer;
   forming a first silicide layer on the bottom surface of the second opening;
   forming a barrier metal layer on an upper surface of the first silicide layer and on a side surface of the second inter-layer insulating layer;
   forming a silicon layer on an upper surface and side surface of the barrier metal layer such that a crevice is formed in an upper surface of the silicon layer along the second opening;
   removing part of the silicon layer; and
   siliciding the silicon layer via the crevice to form a second silicide layer.

2. The method of manufacturing a semiconductor memory device according to claim 1, further comprising the following which are performed after forming the second opening and before forming the second inter-layer insulating layer, namely:
   removing the plurality of first layers via the second opening; and
   forming a plurality of first conductive layers covering an upper surface and lower surface of the first inter-layer insulating layer.

3. The method of manufacturing a semiconductor memory device according to claim 1, wherein
   the first layers are conductive layers, and
   a plurality of first conductive layers is formed by forming the second opening.

4. The method of manufacturing a semiconductor memory device according to claim 1, further comprising the following which are performed after removing part of the silicon layer, namely:
   forming a metal layer in the crevice;
   performing heat treatment to form the second silicide layer; and
   removing the metal layer.

5. The method of manufacturing a semiconductor memory device according to claim 1, further comprising the following which is performed after forming the second silicide layer, namely
   sequentially forming a second barrier metal layer and a second conductive layer on an upper surface of the second silicide layer and on the side surface of the second inter-layer insulating layer.

6. A method of manufacturing a semiconductor memory device, comprising:
   alternately stacking a plurality of first inter-layer insulating layers and first layers above a substrate;
   forming a first opening that penetrates a plurality of the first inter-layer insulating layers and first layers;
   forming a gate insulating layer and a semiconductor layer on an inner wall of the first opening;
   forming a second opening that penetrates a plurality of the first inter-layer insulating layers and first layers;
   forming a second inter-layer insulating layer on a bottom surface and an inner wall of the second opening;
   removing a portion covering the bottom surface of the second opening, of the second inter-layer insulating layer;
   forming a first silicide layer on the bottom surface of the second opening;
   forming a barrier metal layer on an upper surface of the first silicide layer and on a side surface of the second inter-layer insulating layer;
   forming a silicon layer on an upper surface and side surface of the barrier metal layer to form a cavity covered by the silicon layer inside the second opening;
   removing part of the silicon layer to form a third opening communicating with the cavity; and
   siliciding the silicon layer via the third opening to form a second silicide layer.

7. The method of manufacturing a semiconductor memory device according to claim 6, further comprising the following which are performed after forming the second opening and before forming the second inter-layer insulating layer, namely:
   removing the plurality of first layers via the second opening; and
   forming a plurality of first conductive layers covering an upper surface and lower surface of the first inter-layer insulating layer.

8. The method of manufacturing a semiconductor memory device according to claim 6, wherein
the first layers are conductive layers, and
a plurality of first conductive layers is formed by forming the second opening.

9. The method of manufacturing a semiconductor memory device according to claim 6, further comprising the following which are performed after forming the third opening in the silicon layer, namely:
forming a metal layer inside the third opening and the cavity;
performing heat treatment to form the second silicide layer; and
removing the metal layer.

10. The method of manufacturing a semiconductor memory device according to claim 6, further comprising the following which is performed after forming the second silicide layer, namely
sequentially forming a second barrier metal layer and a second conductive layer on an upper surface of the second silicide layer and on the side surface of the second inter-layer insulating layer.

\* \* \* \* \*